United States Patent
Terasaki

(10) Patent No.: US 12,027,434 B2
(45) Date of Patent: Jul. 2, 2024

(54) BONDED BODY OF COPPER AND CERAMIC, INSULATING CIRCUIT SUBSTRATE, BONDED BODY OF COPPER AND CERAMIC PRODUCTION METHOD, AND INSULATING CIRCUIT SUBSTRATE PRODUCTION METHOD

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 1029 days.

(21) Appl. No.: 16/960,648

(22) PCT Filed: Jan. 16, 2019

(86) PCT No.: PCT/JP2019/001045
§ 371 (c)(1),
(2) Date: Jul. 8, 2020

(87) PCT Pub. No.: WO2019/146464
PCT Pub. Date: Aug. 1, 2019

(65) Prior Publication Data
US 2020/0365475 A1 Nov. 19, 2020

(30) Foreign Application Priority Data

Jan. 25, 2018 (JP) .................................. 2018-010965
Dec. 4, 2018 (JP) .................................. 2018-227472

(51) Int. Cl.
*B32B 15/20* (2006.01)
*B23K 20/16* (2006.01)
(Continued)

(52) U.S. Cl.
CPC .......... *H01L 23/142* (2013.01); *B23K 20/165* (2013.01); *C04B 37/02* (2013.01);
(Continued)

(58) Field of Classification Search
None
See application file for complete search history.

(56) References Cited

U.S. PATENT DOCUMENTS 4,639,388 A 1/1987 Ainsworth et al.
4,763,828 A 8/1988 Fukaya et al.
(Continued)

FOREIGN PATENT DOCUMENTS

CN 101391901 A 3/2009
CN 102194765 A 9/2011
(Continued)

OTHER PUBLICATIONS

Machine translation of JP2005-305526 (Year: 2005).*
(Continued)

*Primary Examiner* — Mary I Omori
(74) *Attorney, Agent, or Firm* — Locke Lord LLP; James E. Armstrong, IV; Nicholas J. DiCeglie, Jr.

(57) ABSTRACT

A bonded body of copper and ceramic includes: a copper member made of copper or a copper alloy and a ceramic member made of an aluminum oxide, the copper member and the ceramic member being bonded to each other; a magnesium oxide layer which is formed on a ceramic member side between the copper member and the ceramic member; and a Mg solid solution layer which is formed between the magnesium oxide layer and the copper member and contains Mg in a state of a solid solution in a Cu primary phase, in which one or more active metals selected from Ti, Zr, Nb, and Hf are present in the Mg solid solution layer.

8 Claims, 8 Drawing Sheets

(51) Int. Cl.
*C04B 37/02* (2006.01)
*H01L 23/14* (2006.01)
*H01L 23/373* (2006.01)
*B32B 15/04* (2006.01)

(52) U.S. Cl.
CPC ...... *H01L 23/3731* (2013.01); *H01L 23/3735* (2013.01); *B32B 15/04* (2013.01); *B32B 15/20* (2013.01)

(56) References Cited

U.S. PATENT DOCUMENTS

| | | | |
|---|---|---|---|
| 4,838,474 A | 6/1989 | Ohashi et al. | |
| 6,050,478 A | 4/2000 | Saint-Antonin et al. | |
| 6,086,990 A | 7/2000 | Sumino et al. | |
| 2005/0095442 A1 | 5/2005 | Byers et al. | |
| 2016/0016245 A1* | 1/2016 | Terasaki | B23K 35/286 228/123.1 |
| 2017/0062305 A1 | 3/2017 | Terasaki et al. | |
| 2017/0207415 A1 | 7/2017 | Ii | |
| 2017/0261852 A1 | 9/2017 | Kato et al. | |
| 2018/0323122 A1 | 11/2018 | Kuromitsu et al. | |
| 2022/0208412 A1 | 6/2022 | Furukawa et al. | |
| 2022/0375697 A1 | 11/2022 | Hayashi et al. | |

FOREIGN PATENT DOCUMENTS

| | | |
|---|---|---|
| CN | 102489805 A | 6/2012 |
| CN | 102554385 A | 7/2012 |
| CN | 103231181 A | 8/2013 |
| CN | 103717552 A | 4/2014 |
| CN | 104064534 A | 9/2014 |
| CN | 105458547 A | 4/2016 |
| CN | 106825978 A | 6/2017 |
| JP | 63-220987 A | 9/1988 |
| JP | H02-307875 A | 12/1990 |
| JP | 03-112874 A | 5/1991 |
| JP | 04-162756 A | 6/1992 |
| JP | 3211856 B2 | 9/2001 |
| JP | 2005-305526 A | 11/2005 |
| JP | 4375730 B2 | 12/2009 |
| JP | 2012-064801 A | 3/2012 |
| JP | 2012-129548 A | 7/2012 |
| JP | 2015-224151 A | 12/2015 |
| JP | 2017-183716 A | 10/2017 |
| JP | 2018-032732 A | 3/2018 |
| TW | 407140 B | 10/2000 |
| TW | 201821390 A | 6/2018 |
| WO | WO-0134860 A1 * | 5/2001 ........... B23K 35/262 |
| WO | 2013/047330 A1 | 4/2013 |
| WO | 2017/077761 A1 | 5/2017 |

OTHER PUBLICATIONS

Kumamoto et al., Atomic structures of a liquidphase bonded metal/nitride heterointerface, Mar. 10, 2016 (Year: 2016).*
Hillen et al., machine translation of WO 01/34860, May 17, 2001 (Year: 2001).*
Supplementary European Search Report dated Sep. 17, 2021, issued for European Patent Application No. 19743195.0.
International Search Report dated Mar. 12, 2019, issued for PCT/JP2019/001045 and English translation thereof.
Office Action dated Dec. 13, 2021, issued for Taiwanese Patent Application No. 108102326 and an English translation of the Search Report.
Gao Longqiao, "Recent Development of Ceramic to Metal Seal and its Relative Technology," Vacuum Electronics Technology, Issue 05, Oct. 30, 2000, p. 18-24 and English abstract thereof. (cited in the Jan. 20, 2022 Notice of Allowance issued for CN201980007305.6).
Notice of Allowance dated Jan. 20, 2022, issued for Chinese Patent Application No. 201980007305.6 and English translation thereof.
International Search Report dated Nov. 19, 2019, issued for PCT/JP2019/033427 and English translation thereof.
Supplementary European Search Report dated May 11, 2022, issued for the European patent application No. 19854223.5.
Office Action dated Apr. 24, 2022, issued for Chinese Patent Application No. 2019800561670 and a partial English translation of Search Report.
Office Action dated Sep. 26, 2022, issued for Taiwan Patent Application No. 108130463 and English translation of the Search Report.
Restriction Requirement issued in U.S. Appl. No. 17/270,133, dated Sep. 15, 2023.
Non-Final Office Action issued in U.S. Appl. No. 17/270,133, dated Nov. 1, 2023.

* cited by examiner

BONDED BODY OF COPPER AND CERAMIC, INSULATING CIRCUIT SUBSTRATE, BONDED BODY OF COPPER AND CERAMIC PRODUCTION METHOD, AND INSULATING CIRCUIT SUBSTRATE PRODUCTION METHOD

TECHNICAL FIELD

This invention relates to a bonded body of copper and ceramic in which a copper member made of copper or a copper alloy and a ceramic member made of an aluminum oxide are bonded to each other, an insulating circuit substrate, a bonded body of copper and ceramic production method, and an insulating circuit substrate production method.

Priority is claimed on Japanese Patent Application No. 2018-010965, filed on Jan. 25, 2018, and Japanese Patent Application No. 2018-227472, filed on Dec. 4, 2018, the contents of which are incorporated herein by reference.

BACKGROUND ART

A power module, an LED module, and a thermoelectric module have a structure in which a power semiconductor element, an LED element, and a thermoelectric element are bonded to an insulating circuit substrate in which a circuit layer made of a conductive material is formed on one surface of an insulating layer.

For example, a power semiconductor element for large power control, which is used to control wind power generation, an electric vehicle, a hybrid vehicle, and the like, generates a large amount of heat during operation. Therefore, as a board having such a power semiconductor element mounted thereon, for example, an insulating circuit substrate provided with a ceramic substrate made of an aluminum oxide or the like, and a circuit layer formed by bonding a metal sheet having excellent conductivity to one surface of the ceramic substrate has been widely used in the related art. As an insulating circuit substrate, one having a metal layer formed by bonding a metal sheet to the other surface of the ceramic substrate is also provided.

For example, Patent Document 1 proposes an insulating circuit substrate in which a first metal sheet and a second metal sheet respectively constituting a circuit layer and a metal layer are respectively formed of a copper sheet, and the copper sheets are directly bonded to a ceramic substrate by a DBC method. In the DBC method, the copper sheets and the ceramic substrate are bonded by generating a liquid phase at the interfaces between the copper sheets and the ceramic substrate using a eutectic reaction of copper and copper oxides.

In addition, Patent Document 2 proposes an insulating circuit substrate in which a circuit layer and a metal layer are formed by bonding copper sheets to one surface and the other surface of a ceramic substrate. In the insulating circuit substrate, the copper sheets are disposed on one surface and the other surface of the ceramic substrate with a Ag—Cu—Ti-based brazing material interposed therebetween, and the copper sheets are bonded thereto by performing a heating treatment (so-called active metal brazing method). In the active metal brazing method, since the brazing material containing Ti as an active metal is used, the wettability between the molten brazing material and the ceramic substrate is improved, and the ceramic substrate and the copper sheets are reliably bonded to each other.

Furthermore, Patent Document 3 proposes, as a brazing material for bonding, which is used when a copper sheet and a ceramic substrate are bonded to each other in a high temperature nitrogen gas atmosphere, a paste containing a powder made of a Cu—Mg—Ti alloy. In Patent Document 3, a configuration in which bonding is achieved by heating at 560° C. to 800° C. in a nitrogen gas atmosphere is provided, and Mg in the Cu—Mg—Ti alloy sublimates and does not remain at the bonding interface, while titanium nitride (TiN) is not substantially formed.

CITATION LIST

Patent Literature

[Patent Document 1]
　Japanese Unexamined Patent Application, First Publication No. H04-162756
[Patent Document 2]
　Japanese Patent No. 3211856
[Patent Document 3]
　Japanese Patent No. 4375730

SUMMARY OF INVENTION

Technical Problem

However, as disclosed in Patent Document 1, in a case where the ceramic substrate and the copper sheets are bonded according to the DBC method, the bonding temperature needs to be set to 1065° C. or higher (the eutectic point temperature of copper and copper oxides or higher), so that there is concern that the ceramic substrate may deteriorate during bonding.

In addition, as disclosed in Patent Document 2, in a case of bonding the ceramic substrate and the copper sheets according to the active metal brazing method, since the brazing material contains Ag and Ag is present at the bonding interface, migration easily occurs, and use for high voltage applications cannot be achieved. In addition, since the bonding temperature is relatively as high as 900° C., there is also a problem that the ceramic substrate may deteriorate.

Furthermore, as disclosed in Patent Document 3, in a case where bonding is performed in a nitrogen gas atmosphere using a brazing material for bonding, which is formed of the paste containing a powder made of a Cu—Mg—Ti alloy, gas remains at the bonding interface, and there is a problem that partial discharge easily occurs. In addition, since the alloy powder is used, the molten state becomes uneven depending on the composition dispersion of the alloy powder, and there is concern that a region with an insufficient interfacial reaction may be locally formed. Furthermore, there is concern that organic matter contained in the paste remains at the bonding interface and may result in insufficient bonding.

This invention has been made in view of the above-described circumstances, and an objective thereof is to provide a bonded body of copper and ceramic in which a copper member made of copper or a copper alloy and a ceramic member made of an aluminum oxide are reliably bonded to each other and excellent electrochemical migration resistance is achieved, an insulating circuit substrate, a production method of the bonded body of copper and ceramic, and a production method of the insulating circuit substrate.

Solution to Problem

In order to solve these problems and achieve the above-mentioned object, a bonded body of copper and ceramic of the present invention is a bonded body of copper and ceramic including: a copper member made of copper or a copper alloy and a ceramic member made of an aluminum oxide, the copper member and the ceramic member being bonded to each other; a magnesium oxide layer which is formed on a ceramic member side between the copper member and the ceramic member; and a Mg solid solution layer which is formed between the magnesium oxide layer and the copper member and contains Mg in a state of a solid solution in a Cu primary phase, in which one or more active metals selected from Ti, Zr, Nb, and Hf are present in the Mg solid solution layer.

In the bonded body of copper and ceramic having the configuration, the magnesium oxide layer is formed on the ceramic member side between the copper member made of copper or a copper alloy and the ceramic member made of an aluminum oxide. The magnesium oxide layer is formed by the reaction between magnesium (Mg) disposed between the ceramic member and the copper member and oxygen (O) in the ceramic member, and thus the ceramic member sufficiently reacts.

In addition, the Mg solid solution layer containing Mg in a state of a solid solution in the Cu primary phase is formed between the magnesium oxide layer and the copper member and the one or more active metals selected from Ti, Zr, Nb, and Hf are present in the Mg solid solution layer, so that Mg disposed between the ceramic member and the copper member is sufficiently diffused on the copper member side and furthermore, the active metal disposed between the ceramic member and the copper member and Cu in the copper member are sufficiently reacted to each other.

Therefore, the bonded body of copper and ceramic in which the interfacial reaction sufficiently proceeds at the bonding interface between the copper member and the ceramic member and the copper member and the ceramic member are reliably bonded to each other can be obtained. In addition, since Ag is not present at the bonding interface, excellent electrochemical migration resistance is also achieved.

In the bonded body of copper and ceramic of the present invention, intermetallic compound phases containing Cu and the active metal may be dispersed in the Mg solid solution layer.

In a case where Ti, Zr, and Hf are contained as the active metals, the active metals in the Mg solid solution layer are present as the intermetallic compound phase of Cu and the active metals. Therefore, since the intermetallic compound phase of Cu and the active metals is present in the Mg solid solution layer, Mg disposed between the ceramic member and the copper member is sufficiently diffused on the copper member side and Cu and the active metal are sufficiently reacted to each other. Therefore, the bonded body of copper and ceramic in which the copper member and the ceramic member are reliably bonded to each other can be obtained.

In the bonded body of copper and ceramic of the present invention, it is preferable that Cu particles are dispersed in the magnesium oxide layer.

In this case, Cu of the copper member and the ceramic member are sufficiently reacted to each other, so that it becomes possible to obtain the bonded body of copper and ceramic in which the copper member and the ceramic member are firmly bonded to each other. The Cu particles are Cu simple substance or an intermetallic compound containing Cu, and are formed by the precipitation of Cu present in a liquid phase when the magnesium oxide layer is formed.

In the bonded body of copper and ceramic of the present invention, it is preferable that an area ratio of Cu—Mg intermetallic compound phases is 15% or less in a region from a bonding surface of the ceramic member to 50 μm toward the copper member side between the ceramic member and the copper member.

In this case, since the area ratio of the Cu—Mg intermetallic compound phase which is brittle is limited to 15% or less, for example, even in a case where ultrasonic bonding or the like is performed, it becomes possible to suppress the occurrence of cracking or the like at the bonding interface.

Examples of the above-mentioned Cu—Mg intermetallic compound phase include a $Cu_2Mg$ phase and a $CuMg_2$ phase.

In the bonded body of copper and ceramic of the present invention, it is preferable that a thickness of the magnesium oxide layer is in a range of 50 nm or more and 1000 nm or less.

In this case, since the thickness of the magnesium oxide layer formed on the ceramic member side is in a range of 50 nm or more and 1000 nm or less, the occurrence of cracking in the ceramic member when a thermal cycle is applied can be suppressed.

An insulating circuit substrate of the present invention includes is an insulating circuit substrate including: a copper sheet made of copper or a copper alloy and a ceramic substrate made of an aluminum oxide, the copper sheet being bonded to a surface of the ceramic substrate; a magnesium oxide layer which is formed between the copper sheet and the ceramic substrate on the ceramic substrate side; and a Mg solid solution layer which is formed between the magnesium oxide layer and the copper sheet and contains Mg in a state of a solid solution in a Cu primary phase, in which one or more active metals selected from Ti, Zr, Nb, and Hf are present in the Mg solid solution layer.

In the insulating circuit substrate having the configuration, the copper sheet and the ceramic substrate are reliably bonded to each other, and excellent electrochemical migration resistance is achieved, so that the insulating circuit substrate can be used with high reliability even under high voltage conditions.

In the insulating circuit substrate of the present invention, intermetallic compound phases containing Cu and the active metal may be dispersed in the Mg solid solution layer.

In a case where Ti, Zr, and Hf are contained as the active metals, the active metals in the Mg solid solution layer are present as the intermetallic compound phase of Cu and the active metals. Therefore, since the intermetallic compound phase of Cu and the active metals is present in the Mg solid solution layer, the insulating circuit substrate in which the copper sheet and the ceramic substrate are reliably bonded to each other can be obtained.

In the insulating circuit substrate of the present invention, it is preferable that Cu particles are dispersed in the magnesium oxide layer.

In this case, Cu of the copper sheet and the ceramic substrate are sufficiently reacted to each other, so that it becomes possible to obtain the insulating circuit substrate in which the copper sheet and the ceramic substrate are firmly bonded to each other. The Cu particles are Cu simple substance or an intermetallic compound containing Cu, and are formed by the precipitation of Cu present in a liquid phase when the magnesium oxide layer is formed.

In the insulating circuit substrate of the present invention, it is preferable that an area ratio of Cu—Mg intermetallic compound phases is 15% or less in a region from a bonding surface of the ceramic substrate to 50 µm toward the copper sheet side between the ceramic substrate and the copper sheet.

In this case, since the area ratio of the Cu—Mg intermetallic compound phase which is brittle is limited to 15% or less, for example, even in a case where ultrasonic bonding or the like is performed, it becomes possible to suppress the occurrence of cracking or the like at the bonding interface.

Examples of the above-mentioned Cu—Mg intermetallic compound phase include a $Cu_2Mg$ phase and a $CuMg_2$ phase.

In the insulating circuit substrate of the present invention, it is preferable that a thickness of the magnesium oxide layer is in a range of 50 nm or more and 1000 nm or less.

In this case, since the thickness of the magnesium oxide layer formed on the ceramic substrate side is in a range of 50 nm or more and 1000 nm or less, the occurrence of cracking in the ceramic substrate when a thermal cycle is applied can be suppressed.

A production method of a bonded body of copper and ceramic of the present invention is a production method of a bonded body of copper and ceramic for producing the above-described bonded body of copper and ceramic, the production method including: an active metal and Mg disposing step of disposing a simple substance of one or more active metals selected from Ti, Zr, Nb, and Hf and a Mg simple substance between the copper member and the ceramic member; a laminating step of laminating the copper member and the ceramic member with the active metal and Mg interposed therebetween; and a bonding step of performing a heating treatment on the copper member and the ceramic member laminated with the active metal and Mg interposed therebetween in a state of being pressed in a laminating direction under a vacuum atmosphere so as to bond the copper member and the ceramic member to each other, in which, in the active metal and Mg disposing step, an amount of the active metal is in a range of 0.4 µmol/cm$^2$ or more and 47.0 µmol/cm$^2$ or less, and an amount of Mg is in a range of 7.0 µmol/cm$^2$ or more and 143.2 µmol/cm$^2$ or less.

According to the production method of a bonded body of copper and ceramic having the above configuration, since the simple substance of the active metal and the Mg simple substance are disposed between the copper member and the ceramic member and are subjected to the heating treatment in a state of being pressed in the laminating direction under the vacuum atmosphere, no gas or residue of organic matter remains at the bonding interface. In addition, since the simple substance of the active metal and the Mg simple substance are disposed, there is no composition dispersion and a uniform liquid phase is generated.

In addition, in the active metal and Mg disposing step, since the amount of the active metal is in a range of 0.4 µmol/cm$^2$ or more and 47.0 µmol/cm$^2$ or less, and the amount of Mg is in a range of 7.0 µmol/cm$^2$ or more and 143.2 µmol/cm$^2$ or less, a liquid phase necessary for the interfacial reaction can be sufficiently obtained, and an excessive reaction of the ceramic member can be suppressed.

Therefore, the bonded body of copper and ceramic in which the copper member and the ceramic member are reliably bonded to each other can be obtained. In addition, since Ag is not used for bonding, the bonded body of copper and ceramic excellent in electrochemical migration resistance can be obtained.

In the production method of a bonded body of copper and ceramic of the present invention, it is preferable that a pressurizing load in the bonding step is in a range of 0.049 MPa or more and 3.4 MPa or less, and a heating temperature in the bonding step is in a range of 500° C. or higher and 850° C. or lower in a case where Cu and Mg are laminated in a contact state and is in a range of 670° C. or higher and 850° C. or lower in a case where Cu and Mg are laminated in a non-contact state.

In this case, since the pressurizing load in the bonding step is in a range of 0.049 MPa or more and 3.4 MPa or less, the ceramic member, the copper member, the active metal, and Mg can be brought into close contact, so that the interfacial reactions therebetween during heating can be promoted.

Since the heating temperature in the bonding step is equal to or higher than 500° C., which is higher than the eutectic temperature of Cu and Mg in a case where Cu and Mg are laminated in a contact state and is equal to or higher than 670° C., which is higher than the melting point Mg in a case where Cu and Mg are laminated in a non-contact state, a liquid phase can be sufficiently generated at the bonding interface.

Since the heating temperature in the bonding step is 850° C. or lower, the occurrence of the eutectic reaction between Cu and the active metal can be suppressed, and the excessive generation of the liquid phase can be suppressed. Furthermore, the thermal load on the ceramic member is reduced, so that the deterioration of the ceramic member can be suppressed.

A production method of an insulating circuit substrate of the present invention is a production method of an insulating circuit substrate for producing the above-described insulating circuit substrate, the production method including: an active metal and Mg disposing step of disposing a simple substance of one or more active metals selected from Ti, Zr, Nb, and Hf and a Mg simple substance between the copper sheet and the ceramic substrate; a laminating step of laminating the copper sheet and the ceramic substrate with the active metal and Mg interposed therebetween; and a bonding step of performing a heating treatment on the copper sheet and the ceramic substrate laminated with the active metal and Mg interposed therebetween in a state of being pressed in a laminating direction under a vacuum atmosphere so as to bond the copper sheet and the ceramic substrate to each other, in which, in the active metal and Mg disposing step, an amount of the active metal is in a range of 0.4 µmol/cm$^2$ or more and 47.0 µmol/cm$^2$ or less, and an amount of Mg is in a range of 7.0 µmol/cm$^2$ or more and 143.2 µmol/cm$^2$ or less.

According to the production method of an insulating circuit substrate having the configuration, the insulating circuit substrate in which the copper sheet and the ceramic substrate are reliably bonded to each other can be obtained. In addition, since Ag is not used for bonding, the insulating circuit substrate excellent in electrochemical migration resistance can be obtained.

In the production method of an insulating circuit substrate of the present invention, it is preferable that a pressurizing load in the bonding step is in a range of 0.049 MPa or more and 3.4 MPa or less, and a heating temperature in the bonding step is in a range of 500° C. or higher and 850° C. or lower in a case where Cu and Mg are laminated in a contact state and is in a range of 670° C. or higher and 850° C. or lower in a case where Cu and Mg are laminated in a non-contact state.

In this case, since the pressurizing load in the bonding step is in a range of 0.049 MPa or more and 3.4 MPa or less, the ceramic substrate, the copper sheet, the active metal, and Mg can be brought into close contact, so that the interfacial reactions therebetween during heating can be promoted.

Since the heating temperature in the bonding step is equal to or higher than 500° C., which is higher than the eutectic temperature of Cu and Mg in a case where Cu and Mg are laminated in a contact state and is equal to or higher than 670° C., which is higher than the melting point Mg in a case where Cu and Mg are laminated in a non-contact state, a liquid phase can be sufficiently generated at the bonding interface.

Since the heating temperature in the bonding step is 850° C. or lower, the occurrence of the eutectic reaction between Cu and the active metal can be suppressed, and the excessive generation of the liquid phase can be suppressed. Furthermore, the thermal load on the ceramic substrate is reduced, so that the deterioration of the ceramic substrate can be suppressed.

Advantageous Effects of Invention

According to the present invention, it becomes possible to provide the bonded body of copper and ceramic in which the copper member made of copper or a copper alloy and the ceramic member made of an aluminum oxide are reliably bonded to each other and excellent electrochemical migration resistance is achieved, the insulating circuit substrate, the production method of the above-described bonded body of copper and ceramic, and the production method of the insulating circuit substrate.

DESCRIPTION OF EMBODIMENTS

Figure 1:
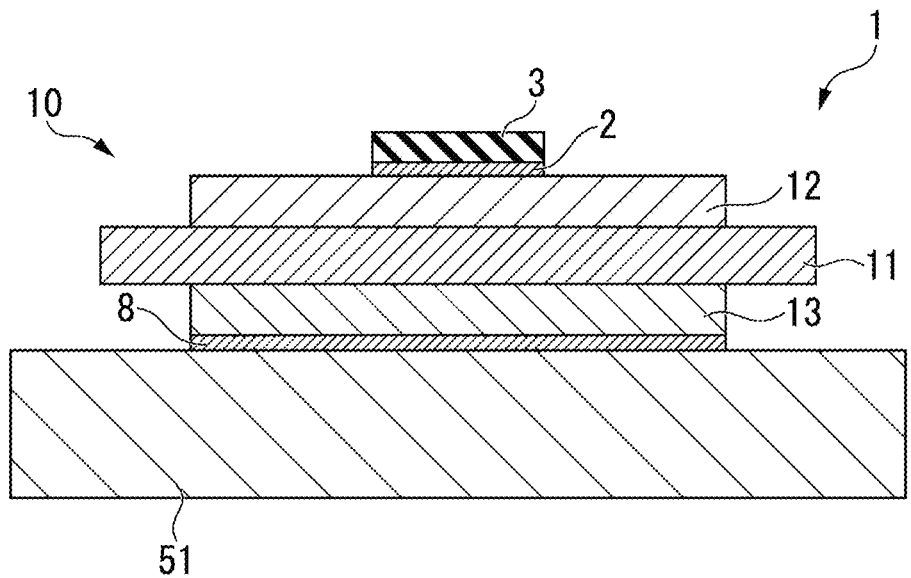
FIG. 1 is a schematic explanatory view of a power module using an insulating circuit substrate according to a first embodiment of the present invention.

Hereinafter, embodiments of the present invention will be described with reference to the accompanying drawings.

First Embodiment

A first embodiment of the present invention will be described with reference to FIGS. 1 to 4.

A bonded body of copper and ceramic according to the present embodiment is an insulating circuit substrate 10 configured by bonding a ceramic substrate 11 which is a ceramic member to a copper sheet 22 (circuit layer 12) and a copper sheet 23 (metal layer 13), which are copper members.

FIG. 1 shows the insulating circuit substrate 10 according to the first embodiment of the present invention and a power module 1 using the insulating circuit substrate 10.

The power module 1 includes the insulating circuit substrate 10, a semiconductor element 3 bonded to one side (upper side in FIG. 1) of the insulating circuit substrate 10 with a first solder layer 2 interposed therebetween, and a heat sink 51 bonded to the other side (lower side in FIG. 1) of the insulating circuit substrate 10 with a second solder layer 8 interposed therebetween.

The insulating circuit substrate 10 includes the ceramic substrate 11, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 prevents the electrical connection between the circuit layer 12 and the metal layer 13, and is made of alumina, which is a kind of aluminum oxide, in the present embodiment. The thickness of the ceramic substrate 11 is set to be in a range of 0.2 to 1.5 mm, and in the present embodiment, the thickness of the ceramic substrate 11 is preferably 0.635 mm.

Figure 4:
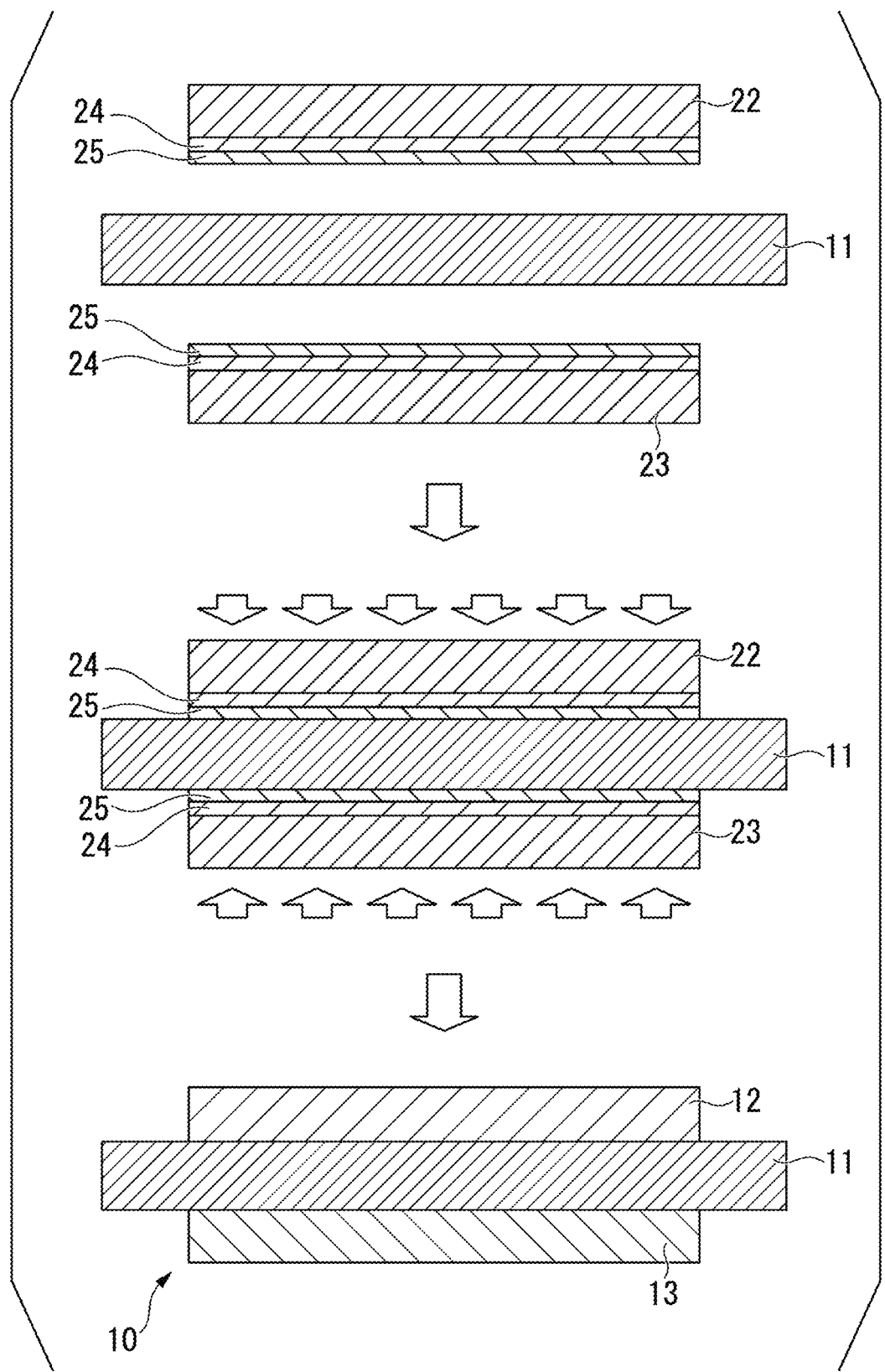
FIG. 4 is an explanatory view showing the production method of the insulating circuit substrate according to the first embodiment of the present invention.

As shown in FIG. 4, the circuit layer 12 is formed by bonding the copper sheet 22 made of copper or a copper alloy to one surface of the ceramic substrate 11. In the present embodiment, a rolled sheet of oxygen-free copper is used as the copper sheet 22 constituting the circuit layer 12. A circuit pattern is formed on the circuit layer 12, and one surface thereof (upper surface in FIG. 1) becomes a mounting surface on which the semiconductor element 3 is mounted. The thickness of the circuit layer 12 is set to be in a range of 0.1 mm or more and 2.0 mm or less, and in the present embodiment, the thickness of the circuit layer 12 is preferably 0.6 mm.

As shown in FIG. 4, the metal layer 13 is formed by bonding the copper sheet 23 made of copper or a copper alloy to the other surface of the ceramic substrate 11. In the present embodiment, a rolled sheet of oxygen-free copper is used as the copper sheet 23 constituting the metal layer 13. The thickness of the metal layer 13 is set to be in a range of 0.1 mm or more and 2.0 mm or less, and in the present embodiment, the thickness of the metal layer 13 is preferably 0.6 mm.

The heat sink 51 is for cooling the above-mentioned insulating circuit substrate 10, and in the present embodiment, is constituted by a heat dissipating sheet made of a material having good thermal conductivity. In the present embodiment, the heat sink 51 is made of copper or a copper alloy excellent in thermal conductivity. The heat sink 51 and the metal layer 13 of the insulating circuit substrate 10 are bonded to each other with the second solder layer 8 interposed therebetween.

The ceramic substrate 11 and the circuit layer 12 (copper sheet 22), and the ceramic substrate 11 and the metal layer 13 (copper sheet 23) are bonded to each other with an active metal film 24 made of one or more active metals selected from Ti, Zr, Nb, and Hf and a Mg film 25 interposed therebetween as shown in FIG. 4. In the present embodiment, Ti is used as the active metal, and the active metal film 24 is a Ti film.

Figure 2:
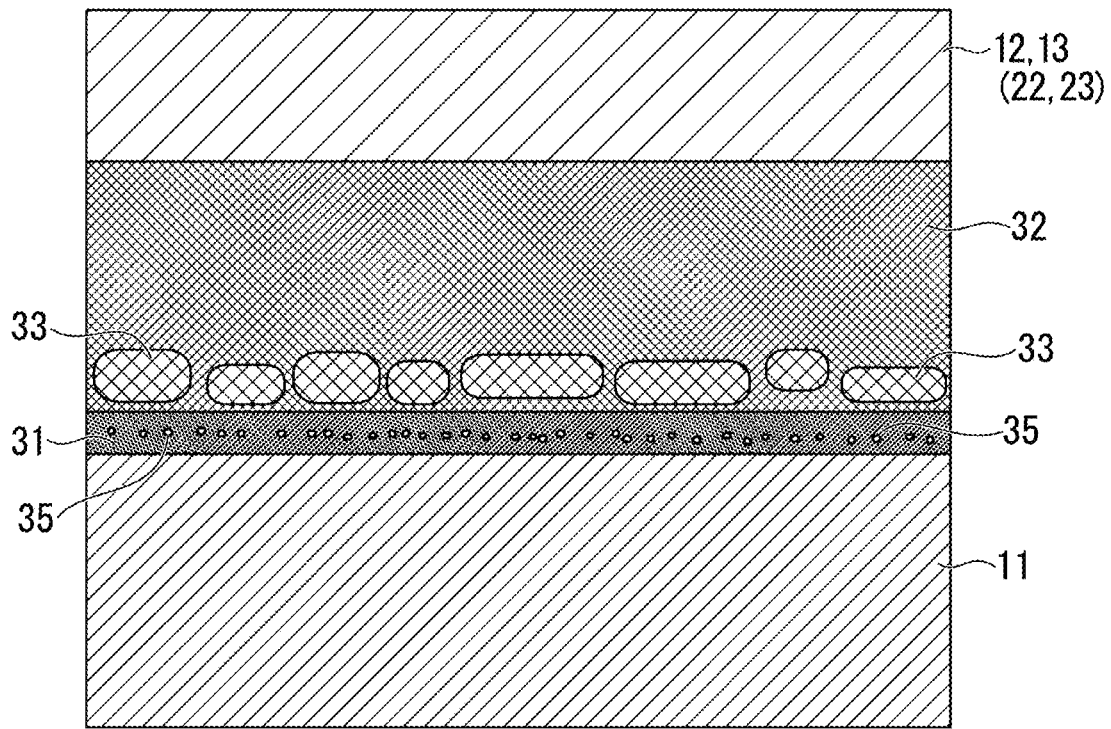
FIG. 2 is a schematic view of a bonding interface between a circuit layer (copper member) and a metal layer (copper member) and a ceramic substrate (ceramic member) of an insulating circuit substrate according to the first embodiment of the present invention.
Figure 3:
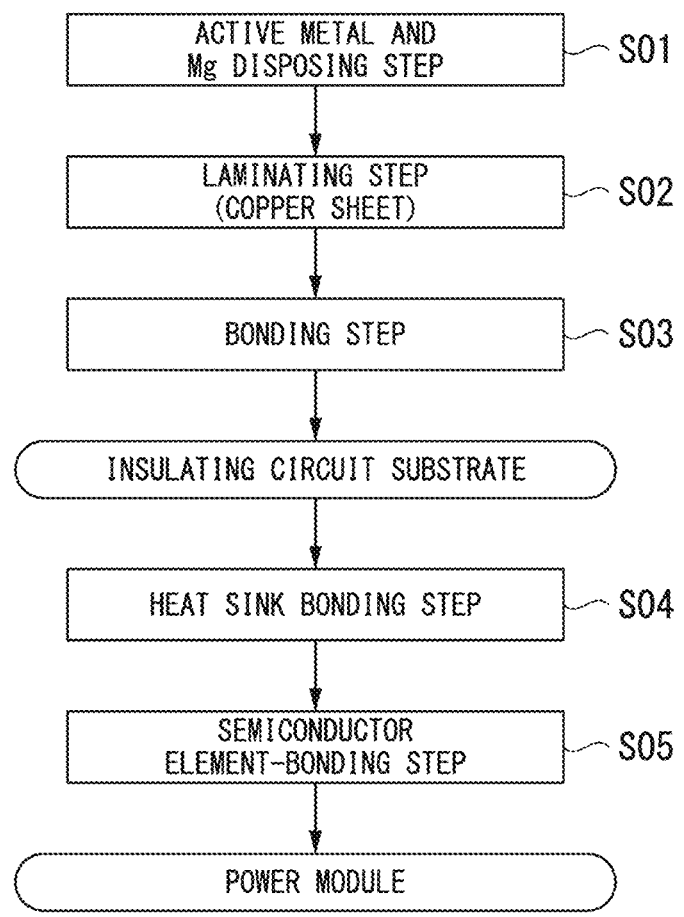
FIG. 3 is a flowchart showing a production method of the insulating circuit substrate according to the first embodiment of the present invention.

At the bonding interface between the ceramic substrate 11 and the circuit layer 12 (copper sheet 22) and the bonding interface between the ceramic substrate 11 and the metal layer 13 (copper sheet 23), as shown in FIG. 2, a structure in which a magnesium oxide layer 31 formed on the ceramic substrate 11 side and a Mg solid solution layer 32 in which Mg is in a state of a solid solution in a Cu primary phase are laminated is provided.

The Mg solid solution layer 32 contains the above-mentioned active metal. In the present embodiment, intermetallic compound phases 33 containing Cu and the active metal is dispersed in the Mg solid solution layer 32. In the present embodiment, Ti is used as the active metal, and examples of intermetallic compounds constituting the intermetallic compound phase 33 containing Cu and Ti include $Cu_4Ti$, $Cu_3Ti_2$, $Cu_4Ti_3$, $CuTi$, $CuTi_2$, and $CuTi_3$.

The amount of Mg in the Mg solid solution layer 32 is in a range of 0.01 at % or more and 3 at % or less. The thickness of the Mg solid solution layer 32 is in a range of 0.1 μm or more and 80 μm or less.

In the present embodiment, Cu particles 35 are dispersed in the magnesium oxide layer 31.

The particle size of the Cu particles 35 dispersed in the magnesium oxide layer 31 is in a range of 10 nm to 100 nm. Furthermore, in the magnesium oxide layer 31, the Cu concentration in an interface region from the interface with the ceramic substrate 11 to 20% of the thickness of the magnesium oxide layer 31 is in a range of 0.3 at % or more and 15 at % or less.

The thickness of the magnesium oxide layer 31 is in a range of 50 nm or more and 1000 nm or less. The thickness of the magnesium oxide layer 31 is more preferably in a range of 50 nm or more and 400 nm or less.

Furthermore, in the present embodiment, the area ratio of Cu—Mg intermetallic compound phases in a region from the bonding surface of the ceramic substrate 11 between the ceramic substrate 11 and the circuit layer 12 (metal layer 13) to 50 μm toward the circuit layer 12 (metal layer 13) side is 15% or less. Examples of the above-described Cu—Mg intermetallic compound phase include a $Cu_2Mg$ phase and a $CuMg_2$ phase.

In the present embodiment, regarding the Cu—Mg intermetallic compound phase described above, the element map of Mg of a region (400 μm×600 μm) including the bonding interface is acquired under the conditions of a magnification of 2,000 times and an accelerating voltage of 15 kV using the electron micro analyzer (JXA-8539F manufactured by JEOL Ltd.), and a region satisfying that the Cu concentration as a five-point average of quantitative analysis in the region where the presence of Mg is confirmed is 5 at % or more and the Mg concentration is 30 at % or more and 70 at % or less is regarded as Cu—Mg intermetallic compound phases.

Next, a production method of the insulating circuit substrate 10 according to the present embodiment described above will be described with reference to FIGS. 3 and 4.

As shown in FIG. 4, a simple substance of one or more active metals selected from Ti, Zr, Nb, and Hf (in the present embodiment, Ti simple substance) and Mg simple substance are disposed between the copper sheet 22 which is to become the circuit layer 12 and the ceramic substrate 11, and between the copper sheet 23 which is to become the metal layer 13 and the ceramic substrate 11 (active metal and Mg disposing step S01). In the present embodiment, the active metal film 24 (Ti film) and the Mg film 25 are formed by vapor deposition of the active metal (Ti) and Mg, and the Mg film 25 is laminated in a state of not being in contact with the copper sheet 22 (copper sheet 23). In the active metal and Mg disposing step S01, the amount of the active metal is in a range of 0.4 μmol/cm² or more and 47.0 μmol/cm² or less, and the amount of Mg is in a range of 7.0 μmol/cm² or more and 143.2 μmol/cm² or less.

The lower limit of the amount of the active metal is preferably 2.8 μmol/cm² or more, and the upper limit of the amount of the active metal is preferably 18.8 μmol/cm² or less. The lower limit of the amount of Mg is preferably 8.8 μmol/cm² or more, and the upper limit of the amount of Mg is preferably 37.0 μmol/cm² or less.

Next, the copper sheet 22, the ceramic substrate 11, and the copper sheet 23 are laminated with the active metal film 24 (Ti film) and the Mg film 25 interposed therebetween (laminating step S02).

Next, the copper sheet 22, the ceramic substrate 11, and the copper sheet 23 which are laminated are pressed in the laminating direction and are loaded into a vacuum furnace and heated such that the copper sheet 22, the ceramic substrate 11, and the copper sheet 23 are bonded (bonding step S03).

The pressurizing load in the bonding step S03 is in a range of 0.049 MPa or more and 3.4 MPa or less.

In addition, the heating temperature in the bonding step S03 is in a range of 670° C. or higher and 850° C. or lower, which is equal to or higher than the melting point of Mg, because Cu and Mg are laminated in a non-contact state. The lower limit of the heating temperature is preferably 700° C. or higher.

The degree of vacuum in the bonding step S03 is preferably in a range of $1\times10^{-6}$ Pa or more and $1\times10^{-2}$ Pa or less.

The retention time at the heating temperature is preferably in a range of 5 minutes or longer and 360 minutes or shorter. In order to lower the area ratio of the above-described Cu—Mg intermetallic compound phase, the lower limit of the retention time at the heating temperature is preferably 60 minutes or longer. The upper limit of the retention time at the heating temperature is preferably 240 minutes or shorter.

As described above, the insulating circuit substrate 10 according to the present embodiment is produced by the active metal and Mg disposing step S01, the laminating step S02, and the bonding step S03.

Next, the heat sink 51 is bonded to the other surface side of the metal layer 13 of the insulating circuit substrate 10 (heat sink bonding step S04).

The insulating circuit substrate 10 and the heat sink 51 are laminated with the solder material interposed therebetween and are loaded into a heating furnace such that the insulating circuit substrate 10 and the heat sink 51 are soldered to each other with the second solder layer 8 interposed therebetween.

Next, the semiconductor element 3 is bonded to one surface of the circuit layer 12 of the insulating circuit substrate 10 by soldering (semiconductor element-bonding step S05).

The power module 1 shown in FIG. 1 is produced by the above steps.

According to the insulating circuit substrate 10 (bonded body of copper and ceramic) of the present embodiment configured as described above, the copper sheet 22 (circuit layer 12) and the copper sheet 23 (metal layer 13) made of oxygen-free copper and the ceramic substrate 11 made of alumina, which is a kind of aluminum oxide, are bonded to each other with the active metal film 24 (Ti film) and the Mg film 25 interposed therebetween, and the magnesium oxide layer 31 formed on the ceramic substrate 11 side and the Mg solid solution layer 32 in which Mg is in a state of a solid solution in the Cu primary phase are laminated at the bonding interfaces between the ceramic substrate 11 and the circuit layer 12 (copper sheet 22) and between the ceramic substrate 11 and the metal layer 13 (copper sheet 22).

The magnesium oxide layer 31 is formed by the reaction between Mg disposed between the ceramic substrate 11 and the copper sheets 22 and 23 and oxygen of the ceramic substrate 11, and the ceramic substrate 11 sufficiently reacts at the bonding interfaces. In addition, the Mg solid solution layer 32 in which Mg is in a state of a solid solution in the Cu primary phase is formed so as to be laminated on the magnesium oxide layer 31, and the above-mentioned active metal is contained in the Mg solid solution layer 32. In the present embodiment, since the intermetallic compound phase 33 containing Cu and the active metal (Ti) is dispersed in the Mg solid solution layer 31, Mg disposed between the ceramic substrate 11 and the copper sheets 22 and 23 is sufficiently diffused on the copper sheets 22 and 23 side. Furthermore, Cu and the active metal (Ti) are sufficiently reacted to each other.

Therefore, an interfacial reaction proceeds sufficiently at the bonding interfaces between the ceramic substrate 11 and the copper sheets 22 and 23, so that the insulating circuit substrate 10 (bonded body of copper and ceramic) in which the circuit layer 12 (copper sheet 22) and the ceramic substrate 11, and the metal layer 13 (copper sheet 23) and the ceramic substrate 11 are reliably bonded can be obtained. In addition, since Ag is not present at the bonding interface, the insulating circuit substrate 10 (bonded body of copper and ceramic) excellent in electrochemical migration resistance can be obtained.

In particular, in the present embodiment, since the Cu particles 35 are dispersed in the magnesium oxide layer 31, Cu of the copper sheets 22 and 23 sufficiently reacts at the bonding surface of the ceramic substrate 11. Therefore, it becomes possible to obtain the insulating circuit substrate 10 (bonded body of copper and ceramic) in which the copper sheets 22 and 23 and the ceramic substrate 11 are firmly bonded.

According to the production method of the insulating circuit substrate 10 (bonded body of copper and ceramic) of the present embodiment, since the active metal and Mg disposing step S01 of disposing the simple substance of the active metal (Ti) (the active metal film 24) and the Mg simple substance (the Mg film 25) between the copper sheets 22 and 23 and the ceramic substrate 11, the laminating step S02 of laminating the copper sheets 22 and 23 and the ceramic substrate 11 with the active metal film 24 and the Mg film 25 interposed therebetween, and the bonding step S03 of performing the heating treatment on the copper sheet 22, the ceramic substrate 11, and the copper sheet 23 which are laminated in a state of being pressed in the laminating direction in a vacuum atmosphere so as to be bonded together are provided, no gas or residue of organic matter remains at the bonding interface. In addition, since the simple substance of the active metal (Ti) and the Mg simple substance are disposed, there is no composition dispersion and a uniform liquid phase is generated.

In the active metal and Mg disposing step S01, since the amount of the active metal is in a range of 0.4 µmol/cm$^2$ or more and 47.0 µmol/cm$^2$ or less, and the amount of Mg is in a range of 7.0 µmol/cm$^2$ or more and 143.2 µmol/cm$^2$ or less, a liquid phase necessary for the interfacial reaction can be sufficiently obtained, and an excessive reaction of the ceramic substrate 11 can be suppressed.

Therefore, the insulating circuit substrate 10 (bonded body of copper and ceramic) in which the copper sheets 22 and 23 and the ceramic substrate 11 are reliably bonded can be obtained. In addition, since Ag is not used for bonding, the insulating circuit substrate 10 excellent in electrochemical migration resistance can be obtained.

In a case where the amount of the active metal is less than 0.4 µmol/cm$^2$ and the amount of Mg is less than 7.0 µmol/cm$^2$, the interfacial reaction becomes insufficient, and there is concern that the bonding rate may decrease. In addition, in a case where the amount of the active metal exceeds 47.0 µmol/cm$^2$, the intermetallic compound phase 33, which is relatively hard due to the excess of the active metal, is excessively generated, and the Mg solid solution layer 32 becomes too hard, so that there is concern that cracking may occur in the ceramic substrate 11. In addition, in a case where the amount of Mg is more than 143.2 µmol/cm$^2$, the decomposition reaction of the ceramic substrate 11 excessively occurs and Al is excessively generated, so that intermetallic compounds of these and Cu, the active metal (Ti), and Mg are formed in large amounts. Accordingly, there is concern that cracking may occur in the ceramic substrate 11.

From the above description, in the present embodiment, the amount of the active metal is in a range of 0.4 µmol/cm$^2$ or more and 47.0 µmol/cm$^2$ or less, and the amount of Mg is in a range of 7.0 µmol/cm$^2$ or more and 143.2 µmol/cm$^2$ or less.

Furthermore, in the present embodiment, since the pressurizing load in the bonding step S03 is 0.049 MPa or more, the ceramic substrate 11, the copper sheets 22 and 23, the active metal film 24 (Ti film), and the Mg film 25 can be brought into close contact, so that the interfacial reactions therebetween during heating can be promoted.

In addition, since the pressurizing load in the bonding step S03 is 3.4 MPa or less, cracking and the like in the ceramic substrate 11 can be suppressed.

In the present embodiment, since Cu and Mg are laminated in a non-contact state and the heating temperature in the bonding step S03 is 670° C. or higher, which is equal to or higher than the melting point of Mg, a liquid phase can be sufficiently generated at the bonding interfaces. On the other hand, since the heating temperature in the bonding step S03 is 850° C. or lower, the occurrence of the eutectic reaction between Cu and the active metal (Ti) can be suppressed, and the excessive generation of the liquid phase can be suppressed. Furthermore, the thermal load on the ceramic substrate 11 is reduced, so that the deterioration of the ceramic substrate 11 can be suppressed.

Second Embodiment

Next, a second embodiment of the present invention will be described with reference to FIGS. 5 to 8.

A bonded body of copper and ceramic according to the present embodiment is an insulating circuit substrate 110 configured by bonding a ceramic substrate 111 which is a ceramic member to a copper sheet 122 (circuit layer 112) which is a copper member.

Figure 5:
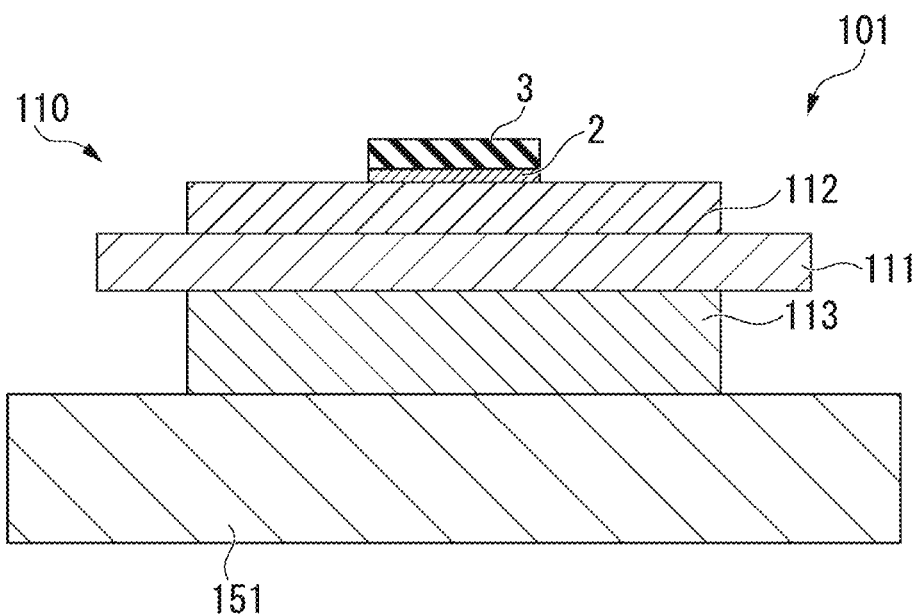
FIG. 5 is a schematic explanatory view of a power module using an insulating circuit substrate according to a second embodiment of the present invention.

FIG. 5 shows the insulating circuit substrate 110 according to the second embodiment of the present invention and a power module 101 using the insulating circuit substrate 110.

The power module 101 includes the insulating circuit substrate 110, the semiconductor element 3 bonded to a surface on one side (upper side in FIG. 5) of the insulating circuit substrate 110 with the solder layer 2 interposed therebetween, and a heat sink 151 disposed on the other side (lower side in FIG. 5) of the insulating circuit substrate 110.

The solder layer 2 is, for example, a Sn—Ag-based, Sn—In-based, or Sn—Ag—Cu-based solder material.

The insulating circuit substrate 110 includes the ceramic substrate 111, the circuit layer 112 disposed on one surface (upper surface in FIG. 5) of the ceramic substrate 111, and a metal layer 113 disposed on the other surface (lower surface in FIG. 5) of the ceramic substrate 111.

The ceramic substrate 111 prevents the electrical connection between the circuit layer 112 and the metal layer 113, and is made of alumina, which is a kind of aluminum oxide, in the present embodiment. The thickness of the ceramic substrate 111 is set to be in a range of 0.2 to 1.5 mm, and is set to 0.635 mm in the present embodiment.

Figure 8:
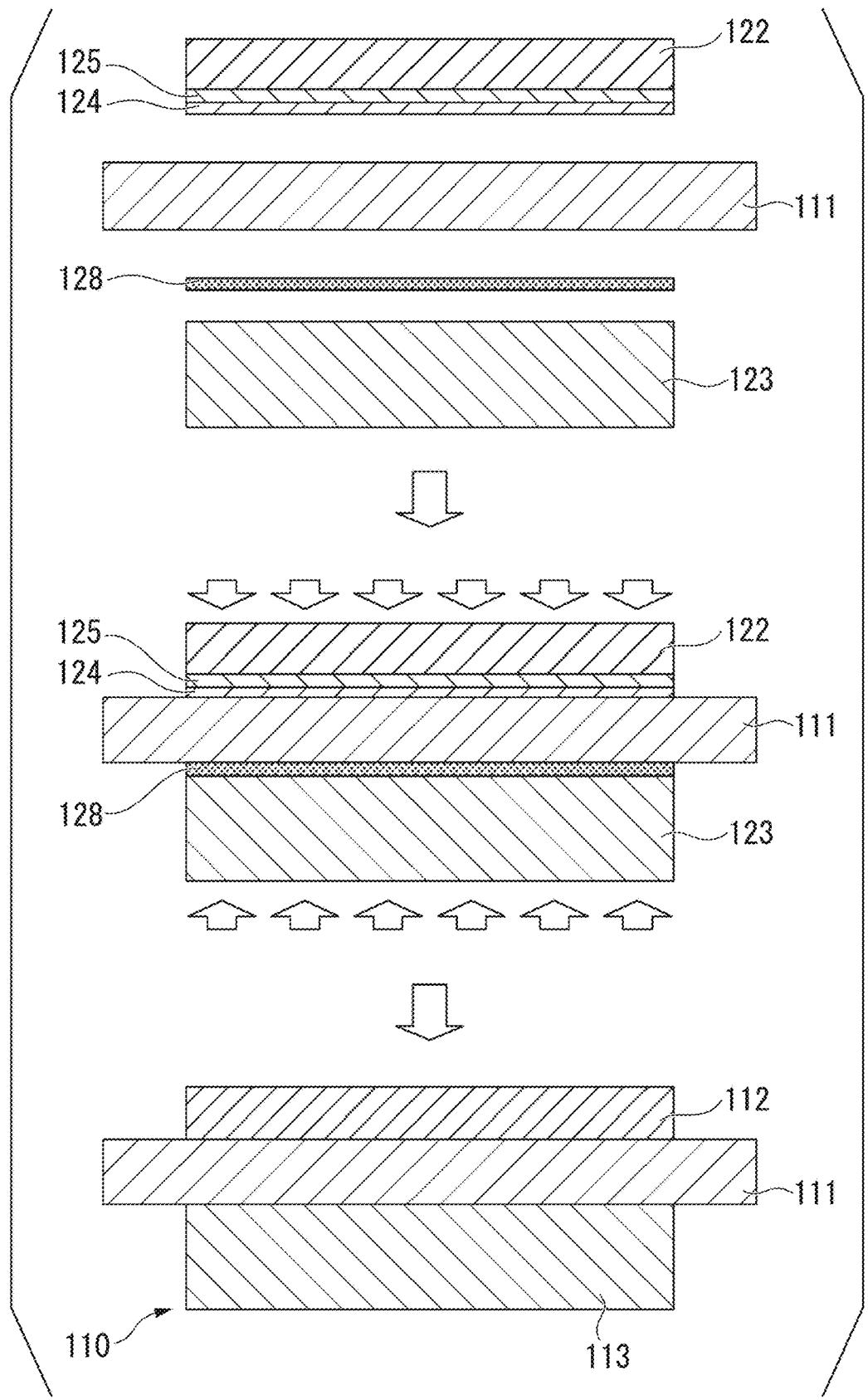
FIG. 8 is an explanatory view showing the production method of the insulating circuit substrate according to the second embodiment of the present invention.

As shown in FIG. 8, the circuit layer 112 is formed by bonding the copper sheet 122 made of copper or a copper alloy to one surface of the ceramic substrate 111. In the present embodiment, a rolled sheet of oxygen-free copper is used as the copper sheet 122 constituting the circuit layer 112. A circuit pattern is formed on the circuit layer 112, and one surface thereof (upper surface in FIG. 5) becomes a mounting surface on which the semiconductor element 3 is mounted. The thickness of the circuit layer 112 is set to be in a range of 0.1 mm or more and 2.0 mm or less, and is set to 0.6 mm in the present embodiment.

As shown in FIG. 8, the metal layer 113 is formed by bonding an aluminum sheet 123 to the other surface of the ceramic substrate 111. In the present embodiment, the metal layer 113 is formed by bonding the aluminum sheet 123 made of a rolled sheet of aluminum having a purity of 99.99 mass % or more (so-called 4N aluminum) to the ceramic substrate 111. The aluminum sheet 123 has a 0.2% yield strength of 30 N/mm$^2$ or less. The thickness of the metal layer 113 (aluminum sheet 123) is set to be in a range of 0.5 mm or more and 6 mm or less, and is set to 2.0 mm in the present embodiment. As shown in FIG. 8, the metal layer 113 is formed by bonding the aluminum sheet 123 to the ceramic substrate 111 using an Al—Si-based brazing material 128.

The heat sink 151 is for cooling the above-mentioned insulating circuit substrate 110, and in the present embodiment, is constituted by a heat dissipating sheet made of a material having good thermal conductivity. In the present embodiment, the heat sink 151 is made of A6063 (aluminum alloy). In the present embodiment, the heat sink 151 is bonded to the metal layer 113 of the insulating circuit substrate 110 using, for example, an Al—Si-based brazing material.

The ceramic substrate 111 and the circuit layer 112 (copper sheet 122) are bonded to each other with an active metal film 124 made of one or more active metals selected from Ti, Zr, Nb, and Hf and a Mg film 125 interposed therebetween as shown in FIG. 8. In the present embodiment, Zr and Hf are used as the active metals, and the active metal film 124 is formed by codeposition of Zr and Hf.

Figure 6:
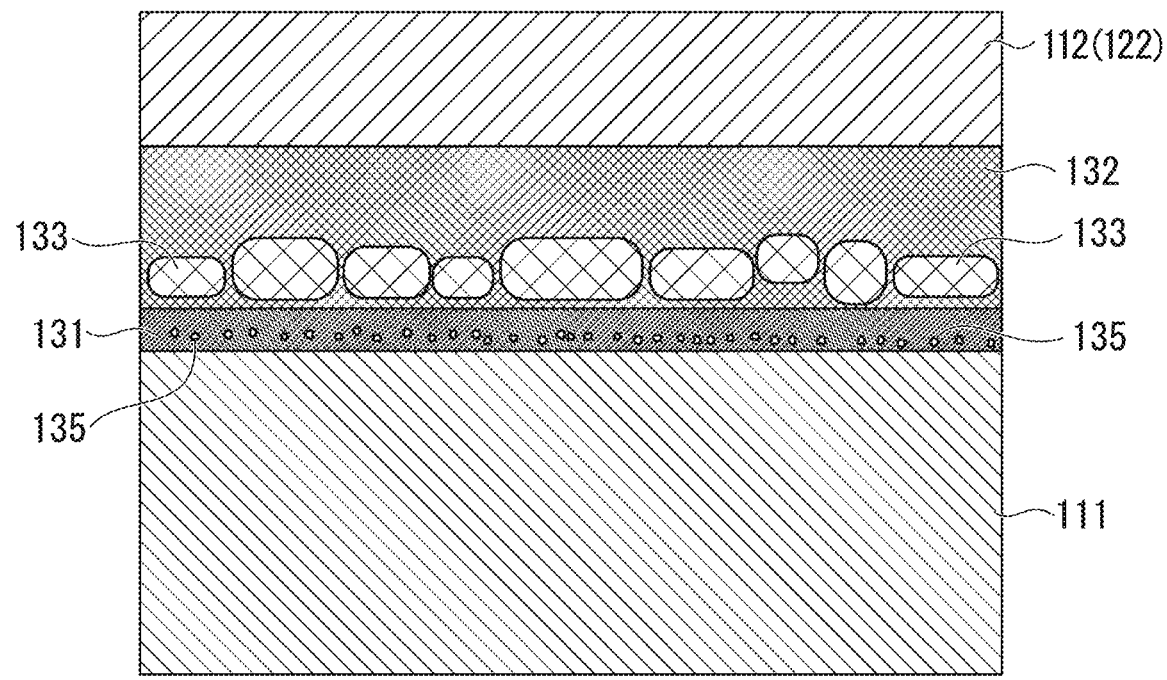
FIG. 6 is a schematic view of a bonding interface between a circuit layer (copper member) and a ceramic substrate (ceramic member) of an insulating circuit substrate according to the second embodiment of the present invention.
Figure 7:
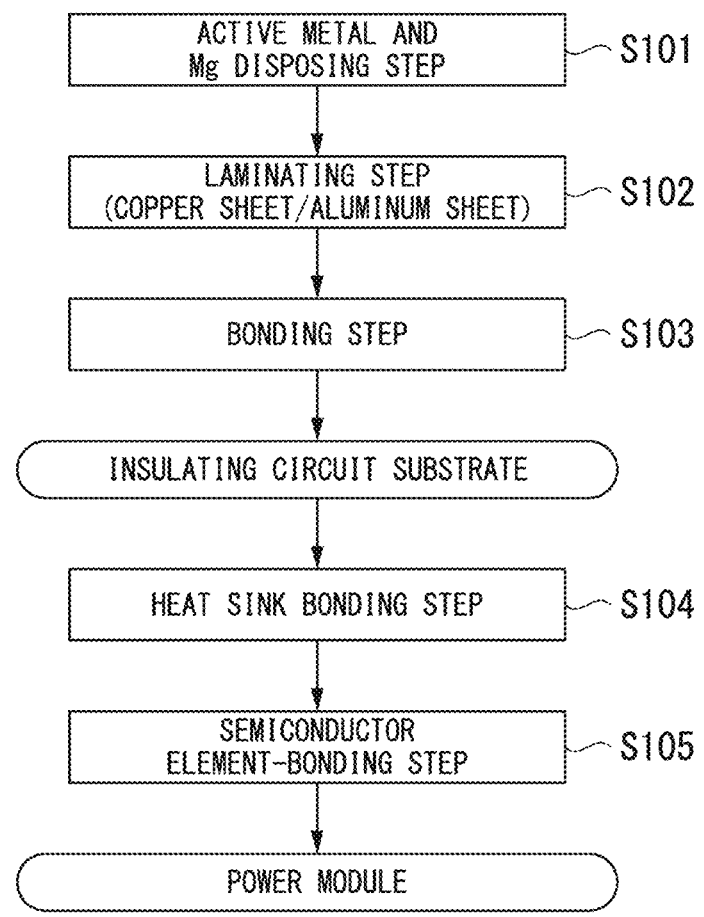
FIG. 7 is a flowchart showing a production method of the insulating circuit substrate according to the second embodiment of the present invention.

At the bonding interface between the ceramic substrate 111 and the circuit layer 112 (copper sheet 122), as shown in FIG. 6, a magnesium oxide layer 131 formed on the ceramic substrate 111 side and a Mg solid solution layer 132 in which Mg is in a state of a solid solution in a Cu primary phase are laminated.

The Mg solid solution layer 132 contains the above-mentioned active metals. In the present embodiment, intermetallic compound phases 133 containing Cu and the active metals (Zr and Hf) is dispersed in the Mg solid solution layer 132. In the present embodiment, Zr and Hf are used as the active metals, and examples of intermetallic compounds constituting the intermetallic compound phase 133 containing Cu, Zr, and Hf include $Cu_5Zr$, $Cu_{51}Zr_{14}$, $Cu_8Zr_3$, $Cu_{10}Zr_7$, $CuZr$, $Cu_5Zr_8$, $CuZr_2$, $Cu_{51}Hf_{14}$, $Cu_8Hf_3$, $Cu_{10}Hf_7$, and $CuHf_2$. The amount of Mg in the Mg solid solution layer 132 is in a range of 0.01 at % or more and 3 at % or less. The thickness of the Mg solid solution layer 132 is in a range of 0.1 μm or more and 80 μm or less.

In the present embodiment, Cu particles 135 are dispersed in the magnesium oxide layer 131.

The particle size of the Cu particles 135 dispersed in the magnesium oxide layer 131 is in a range of 10 nm to 100 nm. Furthermore, in the magnesium oxide layer 131, the Cu concentration in an interface region from the interface with the ceramic substrate 111 to 20% of the thickness of the magnesium oxide layer 131 is in a range of 0.3 at % or more and 15 at % or less.

The thickness of the magnesium oxide layer 131 is in a range of 50 nm or more and 1000 nm or less. The thickness of the magnesium oxide layer 131 is more preferably in a range of 50 nm or more and 400 nm or less.

In the present embodiment, the area ratio of Cu—Mg intermetallic compound phases in a region from the bonding surface of the ceramic substrate 111 between the ceramic substrate 111 and the circuit layer 112 to 50 μm toward the circuit layer 112 side is 15% or less.

Examples of the above-described Cu—Mg intermetallic compound phase include a $Cu_2Mg$ phase and a $CuMg_2$ phase.

In the present embodiment, regarding the Cu—Mg intermetallic compound phase described above, the element map of Mg of a region (400 μm×600 μm) including the bonding interface is acquired under the conditions of a magnification of 2,000 times and an accelerating voltage of 15 kV using the electron micro analyzer (JXA-8539F manufactured by JEOL Ltd.), and a region satisfying that the Cu concentration as a five-point average of quantitative analysis in the region where the presence of Mg is confirmed is 5 at % or more and the Mg concentration is 30 at % or more and 70 at % or less is regarded as Cu—Mg intermetallic compound phases.

Next, a production method of the insulating circuit substrate 110 according to the present embodiment described above will be described with reference to FIGS. 7 and 8.

As shown in FIG. 8, a simple substance of one or more active metals selected from Ti, Zr, Nb, and Hf (in the present embodiment, Zr simple substance and Hf simple substance) and Mg simple substance are disposed between the copper sheet 122 which is to become the circuit layer 112 and the ceramic substrate 111 (active metal and Mg disposing step S101). In the present embodiment, the active metal film 124 and the Mg film 125 are formed by vapor deposition of the active metals (Zr and Hf) and Mg, and the Mg film 125 is formed to be in contact with the copper sheet 122.

In the active metal and Mg disposing step S101, the amount of the active metals is in a range of 0.4 μmol/cm$^2$ or more and 47.0 μmol/cm$^2$ or less, and the amount of Mg is in a range of 7.0 μmol/cm$^2$ or more and 143.2 μmol/cm$^2$ or less.

In a case where the amount of the active metals is less than 0.4 μmol/cm$^2$ and the amount of Mg is less than 7.0

µmol/cm², the interfacial reaction becomes insufficient, and there is concern that the bonding rate may decrease. In addition, in a case where the amount of the active metals exceeds 47.0 µmol/cm², the intermetallic compound phase 133, which is relatively hard due to the excess of the active metals, is excessively generated, and the Mg solid solution layer 132 becomes too hard, so that there is concern that cracking may occur in the ceramic substrate 111. In addition, in a case where the amount of Mg is more than 143.2 µmol/cm², the decomposition reaction of the ceramic substrate 111 excessively occurs and Al is excessively generated, so that intermetallic compounds of these and Cu, the active metals (Ti), and Mg are generated in large amounts. Accordingly, there is concern that cracking may occur in the ceramic substrate 111.

The lower limit of the amount of the active metal is preferably 2.8 µmol/cm² or more, and the upper limit of the amount of the active metal is preferably 18.8 µmol/cm² or less. In addition, the lower limit of the amount of Mg is preferably 8.8 µmol/cm² or more, and the upper limit of the amount of Mg is preferably 37.0 µmol/cm² or less.

Next, the copper sheet 122 and the ceramic substrate 111 are laminated with the active metal film 124 and the Mg film 125 interposed therebetween (laminating step S102).

In the present embodiment, as shown in FIG. 8, the aluminum sheet 123 which is to become the metal layer 113 is laminated on the other surface side of the ceramic substrate 111 with the Al—Si-based brazing material 128 interposed therebetween.

Next, the copper sheet 122, the ceramic substrate 111, and the aluminum sheet 123, which are laminated, are pressed in the laminating direction and are loaded into a vacuum furnace and heated such that the copper sheet 122, the ceramic substrate 111, and the aluminum sheet 123 are bonded (bonding step S103).

The pressurizing load in the bonding step S103 is in a range of 0.049 MPa or more and 3.4 MPa or less.

In addition, the heating temperature in the bonding step S103 is equal to or higher than 500° C., which is equal to or higher than the eutectic temperature of Mg and Cu, and equal to or lower than the eutectic temperature of Cu and the active metals (Zr and Hf), because Cu and Mg are laminated in a contact state. The lower limit of the heating temperature is preferably 700° C. or higher.

In the present embodiment, since the aluminum sheet 123 is bonded using the Al—Si-based brazing material 128, the heating temperature is in a range of 600° C. or higher and 650° C. or lower.

Furthermore, the degree of vacuum in the bonding step S103 is preferably in a range of $1\times10^{-6}$ Pa or more and $1\times10^{-2}$ Pa or less.

In addition, the retention time at the heating temperature is preferably in a range of 5 minutes or longer and 360 minutes or shorter. In order to lower the area ratio of the above-described Cu—Mg intermetallic compound phase, the lower limit of the retention time at the heating temperature is preferably 60 minutes or longer. The upper limit of the retention time at the heating temperature is preferably 240 minutes or shorter.

As described above, the insulating circuit substrate 110 according to the present embodiment is produced by the active metal and Mg disposing step S101, the laminating step S102, and the bonding step S103.

Next, the heat sink 151 is bonded to the other surface side of the metal layer 113 of the insulating circuit substrate 110 (heat sink bonding step S104).

The insulating circuit substrate 110 and the heat sink 151 are laminated with the brazing material interposed therebetween, pressed in the laminating direction, and loaded into a vacuum furnace for brazing. Accordingly, the metal layer 113 of the insulating circuit substrate 110 and the heat sink 151 are bonded to each other. At this time, as the brazing material, for example, an Al—Si-based brazing material foil having a thickness of 20 to 110 µm can be used, and the brazing temperature is preferably set to a temperature lower than the heating temperature in the bonding step S103.

Next, the semiconductor element 3 is bonded to one surface of the circuit layer 112 of the insulating circuit substrate 110 by soldering (semiconductor element-bonding step S105).

The power module 101 shown in FIG. 5 is produced by the above steps.

According to the insulating circuit substrate 110 (bonded body of copper and ceramic) of the present embodiment configured as described above, the copper sheet 122 (circuit layer 112) and the ceramic substrate 111 made of alumina are bonded to each other with the active metal film 124 and the Mg film 125 interposed therebetween, the magnesium oxide layer 131 formed on the ceramic substrate 111 side and the Mg solid solution layer 132 in which Mg is in a state of a solid solution in the Cu primary phase are laminated at the bonding interface between the ceramic substrate 111 and the circuit layer 112 (copper sheet 122), the active metals are present in the Mg solid solution layer 132, and in the present embodiment, the intermetallic compound phase 133 containing Cu and the active metals are dispersed in the Mg solid solution layer 132. Therefore, as in the first embodiment, the insulating circuit substrate 110 (bonded body of copper and ceramic) in which the circuit layer 112 (copper sheet 122) and the ceramic substrate 111 are reliably bonded to each other can be obtained. In addition, since Ag is not present at the bonding interface, the insulating circuit substrate 110 (bonded body of copper and ceramic) excellent in electrochemical migration resistance can be obtained.

In the present embodiment, since the Cu particles 135 are dispersed in the magnesium oxide layer 131, Cu of the copper sheet 122 sufficiently reacts at the bonding surface of the ceramic substrate 111. Therefore, it becomes possible to obtain the insulating circuit substrate 110 (bonded body of copper and ceramic) in which the circuit layer 112 (copper sheet 122) and the ceramic substrate 111 are firmly bonded.

In addition, according to the production method of the insulating circuit substrate 110 (bonded body of copper and ceramic) of the present embodiment, as in the first embodiment, a liquid phase is appropriately generated at the bonding interface between the circuit layer 112 (copper sheet 122) and the ceramic substrate 111 to enable a sufficient interfacial reaction, and the insulating circuit substrate 110 (bonded body of copper and ceramic) in which the copper sheet 122 and the ceramic substrate 111 are reliably bonded to each other can be obtained. Moreover, since Ag is not used for bonding, the insulating circuit substrate 110 excellent in electrochemical migration resistance can be obtained.

In addition, in the present embodiment, since Cu and Mg are laminated in a contact state and the heating temperature in the bonding step S103 is equal to or higher than 500° C., which is equal to or higher than the eutectic temperature of Cu and Mg, a liquid phase can be sufficiently generated at the bonding interface.

Furthermore, in the present embodiment, in the laminating step S102, since the aluminum sheet 123 is laminated on the other surface side of the ceramic substrate 111 with the Al—Si-based brazing material 128 interposed therebetween and the copper sheet 122 and the ceramic substrate 111, and the ceramic substrate 111 and the aluminum sheet 123 are simultaneously bonded, the insulating circuit substrate 110 provided with the circuit layer 112 made of copper and the metal layer 113 made of aluminum can be efficiently produced. In addition, the occurrence of warping in the insulating circuit substrate 110 can be suppressed.

While the embodiments of the present invention have been described above, the present invention is not limited thereto and can be modified as appropriate without departing from the technical spirit of the invention.

For example, although the copper sheet which constitutes the circuit layer or the metal layer is described as the rolled sheet of oxygen-free copper, the copper sheet is not limited thereto, and may also be made of another kind of copper or copper alloy.

In addition, in the second embodiment, although the aluminum sheet constituting the metal layer is described as the rolled sheet of pure aluminum having a purity of 99.99 mass %, the aluminum sheet is not limited thereto, and may also be made of another kind of aluminum or aluminum alloy such as aluminum having a purity of 99 mass % (2N aluminum).

Furthermore, in the present embodiment, although the ceramic substrate is described as being made of alumina, which is a kind of aluminum oxide, the ceramic substrate is not limited thereto, and may be reinforced alumina containing zirconia or the like.

Furthermore, although the heat sink is exemplified by the heat dissipating sheet, the heat sink is not limited thereto, and there is no particular limitation on the structure of the heat sink. For example, one having a passage through which a refrigerant flows or one having a cooling fin may be used. In addition, as the heat sink, a composite material (for example, AlSiC) containing aluminum or an aluminum alloy can also be used.

In addition, a buffer layer made of aluminum or an aluminum alloy or a composite material containing aluminum (for example, AlSiC) may be provided between the top sheet part or heat dissipating sheet of the heat sink and the metal layer.

Furthermore, in the present embodiment, although the formation of the active metal film and the Mg film is described in the active metal and Mg disposing step, the active metal and Mg disposing step is not limited thereto, and the active metal and Mg may be codeposited. Also in this case, the active metal film and the Mg film which are formed are not alloyed, and the simple substance of the active metal and Mg simple substance are disposed. In a case where the active metal and the Mg film are formed by codeposition, Mg and Cu are in a contact state, so that the lower limit of the heating temperature in the bonding step can be set to 500° C. or higher.

In addition, although use of Ti or Zr and Hf as the active metal has been described in the present embodiment, the active metal is not limited thereto, and one or more selected from Ti, Zr, Nb, and Hf may be used as the active metal.

In a case where Zr is used as the active metal, Zr is present as intermetallic compound phases with Cu in the Mg solid solution layer. Examples of intermetallic compounds constituting the intermetallic compound phase include $Cu_5Zr$, $Cu_{51}Zr_{14}$, $Cu_8Zr_3$, $Cu_{10}Zr_7$, $CuZr$, $Cu_5Zr_8$, and $CuZr_2$.

In a case where Hf is used as the active metal, Hf is present as intermetallic compound phases with Cu in the Mg solid solution layer. Examples of intermetallic compounds constituting the intermetallic compound phase include $Cu_{51}Hf_{14}$, $Cu_8Hf_3$, $Cu_{10}Hf_7$, and $CuHf_2$.

In a case where Ti and Zr are used as the active metals, Ti and Zr are present as intermetallic compound phases containing Cu and the active metals in the Mg solid solution layer. Examples of intermetallic compounds constituting the intermetallic compound phases include $Cu_{1.5}Zr_{0.75}Ti_{0.75}$.

In addition, in a case where Nb is used as the active metal, Nb is present as a solid solution in the Mg solid solution layer.

Furthermore, in the active metal and Mg disposing step, the amount of the active metal at the bonding interface may be in a range of 0.4 µmol/cm² or more and 47.0 mol/cm² or less, the amount of Mg may be in a range of 7.0 µmol/cm² or more and 143.2 µmol/cm² or less, and for example, the active metal film and the Mg film may be laminated in multiple layers like Mg film/active metal film/Mg film. Alternatively, a Cu film may be formed between the active metal film and the Mg film.

The simple substance of the active metal and the Mg simple substance may be provided by disposing a foil material or may be formed into a film by sputtering.

In addition, a clad material in which the simple substance of the active metal or the Mg simple substance is laminated may be used, or a paste containing the simple substance of the active metal or the Mg simple substance may be printed.

In addition, in the present embodiment, configurating the power module by mounting the power semiconductor element on the circuit layer of the insulating circuit substrate has been described, but the present embodiment is not limited thereto. For example, an LED module may be configured by mounting an LED element on the insulating circuit substrate, or a thermoelectric module may be configured by mounting a thermoelectric element on the circuit layer of the insulating circuit substrate.

EXAMPLES

Confirmation experiments conducted to confirm the effectiveness of the present invention will be described.

Example 1

Bonded bodies of copper and ceramic having a structure shown in Table 1 were formed. Specifically, a bonded body of copper and ceramic was formed by laminating copper sheets in which the simple substance of an active metal and Mg simple substance were formed into films on both surfaces of a 40 mm square ceramic substrate made of alumina as shown in Table 1 and bonding the laminated sheets under bonding conditions shown in Table L The thickness of the ceramic substrate was 0.635 mm. In addition, the degree of vacuum of the vacuum furnace at the time of bonding was $5 \times 10^{-3}$ Pa.

Regarding the bonded bodies of copper and ceramic obtained as described above, the bonding interface was observed, and a magnesium oxide layer, a Mg solid solution layer, intermetallic compound phases, and the presence or absence of Cu particles and the Cu concentration in the magnesium oxide layer were checked. In addition, the initial bonding rate of the bonded body of copper and ceramic, cracking of the ceramic substrate after thermal cycles, and migration properties were evaluated as follows.

(Mg Solid Solution Layer)

Regarding the bonding interface between copper sheet and the ceramic substrate, a region (400 µm×600 µm) including the bonding interface was observed under the conditions of a magnification of 2,000 times and an accelerating voltage of 15 kV using an EPMA apparatus (JXA- 8539F manufactured by JEOL Ltd.), quantitative analysis was performed on 10 points at intervals of 10 μm from the surface of the ceramic substrate (the surface of the magnesium oxide layer) toward the copper sheet, and a region having a Mg concentration of 0.01 at % or more was regarded as a Mg solid solution layer.

(Presence or Absence of Active Metal in Mg Solid Solution Layer (Presence or Absence of Intermetallic Compound Phases))

Regarding the bonding interface between copper sheet and the ceramic substrate, the element map of an active metal of the region (400 μm×600 μm) including the bonding interface was acquired under the conditions of a magnification of 2,000 times and an accelerating voltage of 15 kV using an electron micro analyzer (JXA-8539F manufactured by JEOL Ltd.), and the presence or absence of the active metal was checked. A region satisfying that the Cu concentration as a five-point average of quantitative analysis in the region where the presence of the active metal was confirmed was 5 at % or more and the active metal concentration was 16 at % or more and 90 at % or less was regarded as intermetallic compound phases.

(Magnesium Oxide Layer)

The bonding interface between copper sheet and the ceramic substrate was observed under the conditions of a magnification of 115,000 times and an accelerating voltage of 200 kV using a scanning transmission electron microscope (Titan ChemiSTEM (with EDS detector) manufactured by Thermo Fisher Scientific), mapping was performed using energy dispersive X-ray analysis (NSS7 manufactured by Thermo Fisher Scientific) to acquire the element map of Mg and O, an electron diffraction pattern was obtained by irradiating a region where Mg and O overlap with each other with an electron beam narrowed to about 1 nm (nano beam diffraction (NBD) method), and the presence or absence of a magnesium oxide layer was checked. The magnesium oxide layer may contain any of magnesia (MgO) and spinel ($MgAl_2O_4$).

In addition, the presence or absence of Cu particles in the region confirmed as the magnesium oxide layer was checked, and the Cu concentration obtained from the 5-point average of the quantitative analysis in this region was regarded as the average concentration of Cu dispersed in the magnesium oxide layer.

(Initial Bonding Rate)

The bonding rate between the copper sheet and the ceramic substrate was determined using the following equation using an ultrasonic flaw detector (FineSAT200 manufactured by Hitachi Power Solutions Co., Ltd.). The initial bonding area was the area to be bonded before bonding, that is, the area of the bonding surface of the copper sheet. In the ultrasonic-detected image, peeling was indicated by a white portion in the bonding part, and thus the area of the white portion was regarded as an exfoliation area.

(Bonding rate)={(initial bonding area)−(exfoliation area)}/(initial bonding area)

(Cracking in Ceramic Substrate)

Using a thermal shock tester (TSA-72ES manufactured by ESPEC Corp.), 250 cycles, where one cycle is 10 minutes at −50° C. and 10 minutes at 150° C., was performed in a gas phase.

The presence or absence cracking in the ceramic substrate after applying the above-mentioned thermal cycles was evaluated.

(Migration)

The electric resistance between circuit patterns was measured after being left for 2,000 hours under the conditions of a distance between the circuit patterns of a circuit layer of 0.8 mm, a temperature of 60° C., a humidity of 60% RH, and a voltage of DC1000V. A case where the resistance value was $1 \times 10^6 \Omega$ or less was determined as a short-circuit, and the migration was evaluated as "B". After being left for 2,000 hours under the same conditions as above, the electric resistance between the circuit patterns was measured. In a case where the resistance value was greater than $1 \times 10^6 \Omega$, the migration was evaluated as "A".

Figure 9:
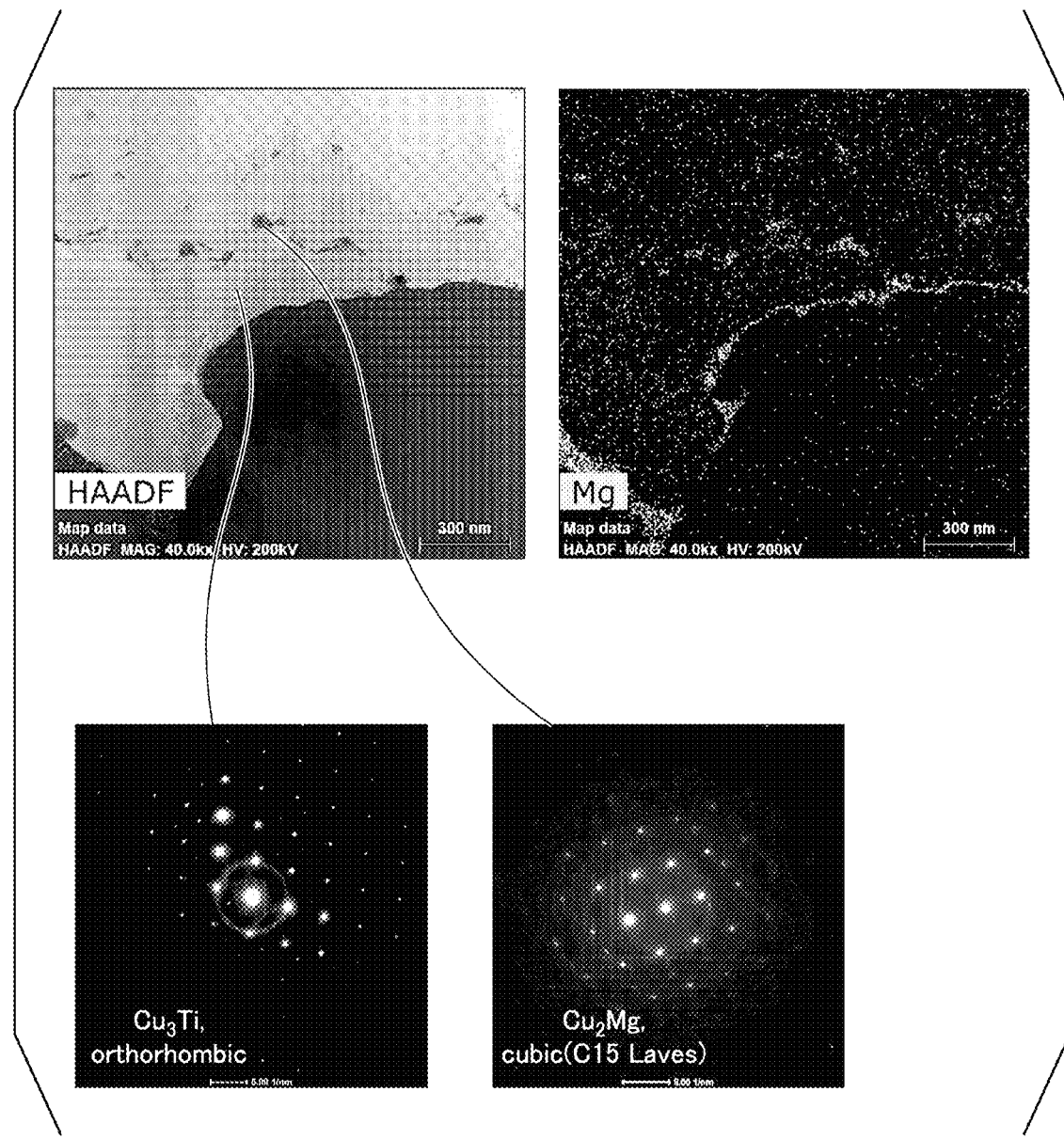
FIG. 9 is an observation result of a bonding interface between a copper sheet and a ceramic substrate in a bonded body of copper and ceramic of Present Invention Example 3.

The evaluation results are shown in Table 2. In addition, the observation results of Present Invention Example 3 are shown in FIG. 9.

TABLE 1

| | | Active metal and Mg disposing step | | | | | | | |
|---|---|---|---|---|---|---|---|---|---|
| | | | Amount of active metal | | Amount of Mg | | Load | Temperature | Time |
| | Film configuration* | Element | mg/cm² | μmol/cm² | mg/cm² | μmol/cm² | MPa | ° C. | min |
| Present Invention Example 1 | Cu/Ti + Mg/$Al_2O_3$ | Ti | 0.02 | 0.4 | 0.40 | 16.6 | 1.96 | 500 | 360 |
| Present Invention Example 2 | Cu/Ti + Mg/$Al_2O_3$ | Ti | 1.06 | 22.1 | 0.52 | 21.2 | 1.96 | 850 | 5 |
| Present Invention Example 3 | Cu/Ti + Mg/$Al_2O_3$ | Ti | 0.23 | 4.8 | 0.42 | 17.2 | 1.96 | 700 | 240 |
| Present Invention Example 4 | Cu/Zr/Mg/$Al_2O_3$ | Zr | 1.35 | 14.8 | 0.31 | 12.9 | 0.98 | 750 | 90 |
| Present Invention Example 5 | Cu/Zr/Mg/$Al_2O_3$ | Zr | 2.53 | 27.7 | 1.35 | 55.7 | 0.98 | 800 | 120 |
| Present Invention Example 6 | Cu/Zr/Mg/$Al_2O_3$ | Zr | 0.16 | 1.8 | 0.17 | 7.0 | 0.98 | 830 | 180 |
| Present Invention Example 7 | Cu/Ti + Zr/Mg/$Al_2O_3$ | Ti | 0.18 | 3.7 | 0.47 | 19.3 | 0.294 | 770 | 150 |
| | | Zr | 0.68 | 7.5 | | | | | |
| Present Invention Example 8 | Cu/Ti + Zr/Mg/$Al_2O_3$ | Ti | 0.34 | 7.2 | 3.48 | 143.2 | 0.294 | 720 | 300 |
| | | Zr | 1.26 | 13.8 | | | | | |
| Present Invention Example 9 | Cu/Mg/Hf/$Al_2O_3$ | Hf | 8.39 | 47.0 | 1.12 | 45.9 | 3.4 | 720 | 300 |
| Present Invention Example 10 | Cu/Mg/Nb/$Al_2O_3$ | Nb | 1.92 | 20.7 | 1.87 | 77.1 | 3.4 | 550 | 30 |
| Present Invention Example 11 | Cu/Ti + Nb + Mg/$Al_2O_3$ | Ti | 0.60 | 12.6 | 1.00 | 41.2 | 0.294 | 600 | 30 |
| | | Nb | 1.39 | 15.0 | | | | | |
| Present Invention Example 12 | Cu/Ti + Hf + Mg/$Al_2O_3$ | Ti | 0.48 | 10.1 | 0.85 | 35.0 | 0.294 | 670 | 240 |
| | | Hf | 0.80 | 4.5 | | | | | |

TABLE 1-continued

| | | Active metal and Mg disposing step | | | | | | | |
|---|---|---|---|---|---|---|---|---|---|
| | | | Amount of active metal | | Amount of Mg | | Load | Temperature | Time |
| | Film configuration* | Element | mg/cm$^2$ | μmol/cm$^2$ | mg/cm$^2$ | μmol/cm$^2$ | MPa | °C. | min |
| Comparative Example 1 | Cu/Ti + Mg/Al$_2$O$_3$ | Ti | 0.22 | 4.6 | 0.09 | 3.6 | 1.96 | 700 | 240 |
| Comparative Example 2 | Cu/Mg/Hf/Al$_2$O$_3$ | Hf | 0.57 | 3.2 | 4.86 | 200.0 | 3.4 | 720 | 300 |
| Comparative Example 3 | Cu/Zr/Mg/Al$_2$O$_3$ | Zr | 0.01 | 0.1 | 0.54 | 22.2 | 0.98 | 750 | 90 |
| Comparative Example 4 | Cu/Ti + Zr/Mg/Al$_2$O$_3$ | Ti | 1.29 | 27.0 | 0.82 | 33.9 | 0.294 | 720 | 300 |
| | | Zr | 3.65 | 40.0 | | | | | |
| Related Art Example 1 | Cu/Ag—Cu—Ti brazing material/Al$_2$O$_3$ | Ti | 0.03 | 0.6 | — | — | 0.49 | 810 | 10 |

*"A + B" means codeposition of A and B.

TABLE 2

| | Observation result of bonding interface | | | | | | Initial bonding ratio % | Presence or absence of ceramic cracking | Migration |
|---|---|---|---|---|---|---|---|---|---|
| | Mg solid solution layer | Presence or absence of active metal | Intermetallic compound phases | Magnesium oxide layer | Cu particles | Cu concentration (at %) | | | |
| Present Invention Example 1 | Present | Present | Present | Present | Present | 0.4 | 93.8 | Absent | A |
| Present Invention Example 2 | Present | Present | Present | Present | Present | 5.4 | 91.9 | Absent | A |
| Present Invention Example 3 | Present | Present | Present | Present | Present | 11.1 | 98.5 | Absent | A |
| Present Invention Example 4 | Present | Present | Present | Present | Present | 8.6 | 98.8 | Absent | A |
| Present Invention Example 5 | Present | Present | Present | Present | Present | 6.7 | 93.6 | Absent | A |
| Present Invention Example 6 | Present | Present | Present | Present | Present | 0.3 | 92.9 | Absent | A |
| Present Invention Example 7 | Present | Present | Present | Present | Present | 9.5 | 97.0 | Absent | A |
| Present Invention Example 8 | Present | Present | Present | Present | Present | 15.0 | 98.4 | Absent | A |
| Present Invention Example 9 | Present | Present | Present | Present | Present | 13.7 | 98.1 | Absent | A |
| Present Invention Example 10 | Present | Present | — | Present | Present | 3.6 | 92.7 | Absent | A |
| Present Invention Example 11 | Present | Present | Present | Present | Present | 0.8 | 91.6 | Absent | A |
| Present Invention Example 12 | Present | Present | Present | Present | Present | 7.3 | 97.8 | Absent | A |
| Comparative Example 1 | Absent | Present | Present | Absent | Present | 0.1 | 63.5 | Absent | A |
| Comparative Example 2 | Present | Present | Present | Present | Present | 17.3 | 91.8 | Present | A |
| Comparative Example 3 | Present | Absent | Absent | Present | Present | 0.2 | 86.1 | Absent | A |
| Comparative Example 4 | Present | Present | Present | Present | Present | 16.8 | 92.1 | Present | A |
| Related Art Example 1 | — | Present | — | — | Absent | — | 98.1 | Absent | B |

* The intermetallic compound phases of Present Invention Example 11 contains Ti and does not contain Nb.

In Comparative Example 1 in which the amount of Mg was smaller than that of the present invention in the active metal and Mg disposing step, the Mg solid solution layer and the magnesium oxide layer were not formed and the initial bonding rate was low. It is presumed that the interfacial reaction was insufficient.

In Comparative Example 2 in which the amount of Mg was larger than that of the present invention in the active metal and Mg disposing step, cracking of the ceramic substrate was confirmed. For this reason, a bonded body of copper and ceramic could not be obtained. It is presumed that this is because the decomposition reaction of the ceramic substrate had excessively occurred, Al was excessively formed, and intermetallic compounds of these and Cu, the active metal, and Mg were formed in large amounts.

In Comparative Example 3 in which the amount of the active metal was smaller than the range of the present invention in the active metal and Mg disposing step, the initial bonding rate was low. It is presumed that this is because the active metal was not present in the Mg solid solution layer and the interfacial reaction was insufficient.

In Comparative Example 4 in which the amount of the active metal was larger than the range of the present invention in the active metal and Mg disposing step, cracking of the ceramic substrate was confirmed. For this reason, a bonded body of copper and ceramic could not be obtained. It is presumed that this is because the amount of the active metal present in the Mg solid solution layer was large and the Mg solid solution layer became too hard.

In an example in the related art in which a ceramic substrate and a copper sheet are bonded to each other using a Ag—Cu—Ti brazing material, migration was determined as "B". It is presumed that this is because Ag is present at the bonding interface.

Contrary to this, in Present Invention Examples 1 to 12, the initial bonding rate was high, and no cracking was confirmed in the ceramic substrate. Also, migration was good.

As shown in FIG. 9, as a result of observation of the bonding interface, a magnesium oxide layer and a Mg solid solution layer were observed, and dispersion of the active metal (intermetallic compound phases) in the Mg solid solution layer was observed.

Example 2

An insulating circuit substrate having a structure shown in Table 3 was formed. Specifically, as shown in Table 5, an insulating circuit substrate having a circuit layer was formed by laminating copper sheets in which the simple substance of an active metal and Mg simple substance were formed into films on both surfaces of a 40 mm square ceramic substrate made of alumina as shown in Table 3 and bonding the laminated sheets under bonding conditions shown in Table 3. The thickness of the ceramic substrate was 0.635 mm. In addition, the degree of vacuum of the vacuum furnace at the time of bonding was $5 \times 10^{-3}$ Pa.

Regarding the insulating circuit substrate obtained as described above, the area ratio of Cu—Mg intermetallic compound phases at the bonding interface between the ceramic substrate and the circuit layer, and the pull strength of a terminal ultrasonically bonded to the circuit layer were evaluated as follows.

(Area Ratio of Cu—Mg Intermetallic Compound Phases)

Regarding the bonding interface between copper sheet and the ceramic substrate, the element map of Mg of a region (120 μm×160 μm) including the bonding interface was acquired under the conditions of a magnification of 750 times and an accelerating voltage of 15 kV using the electron micro analyzer (JXA-8539F manufactured by JEOL Ltd.), and a region satisfying that the Cu concentration as a five-point average of quantitative analysis in the region where the presence of Mg was confirmed was 5 at % or more and the Mg concentration was 30 at % or more and 70 at % or less was regarded as Cu—Mg intermetallic compound phases.

In addition, in an observation visual field, an area A of a region from the bonding surface of the ceramic substrate to 50 μm toward the copper sheet side from the bonding surface of the ceramic substrate was obtained. In this region, an area B of the Cu—Mg intermetallic compound phase was obtained, and the area ratio B/A×100(%) of the Cu—Mg intermetallic compound phase was obtained. As described above, the area ratio of the Cu—Mg intermetallic compound phase was measured in five visual fields, and the average value thereof is described in Table 3.

(Pull Strength)

Figure 10:
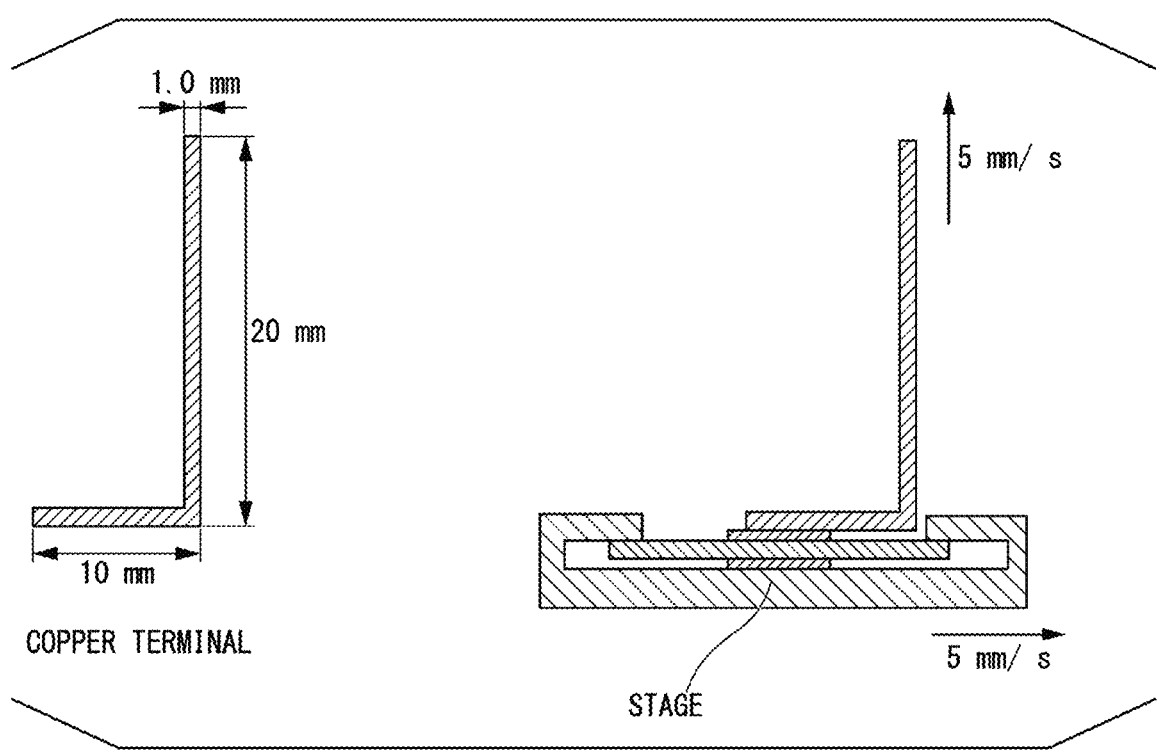
FIG. 10 is an explanatory view showing a method for measuring a pull strength in Example 2.

As shown in FIG. 10, on the circuit layer of the insulating circuit substrate, using an ultrasonic metal bonder (60C-904 manufactured by Ultrasonic Engineering Co., Ltd.), a copper terminal (width 5 mm×thickness 1.0 mm) was ultrasonically bonded under the condition of a collapse amount of 0.3 mm.

A value obtained by dividing the breaking load when the copper terminal was pulled under the conditions of a tool speed of 0.5 mm/s and a stage speed of 0.5 mm/s by the bonding area was described as the pull strength in Table 3.

TABLE 3

| | Active metal and Mg disposing step | | | | | | | | Area ratio % | |
| | | | Amount of active metal | | Amount of Mg | | Load | Temperature | Time | of Cu—Mg intermetallic | Pull strength |
| | Film configuration* | Element | mg/cm² | μmol/cm² | mg/cm² | μmol/cm² | MPa | °C. | min | compound | MPa |
|---|---|---|---|---|---|---|---|---|---|---|---|
| Present Invention Example 21 | Cu/Ti + Mg/Al₂O₃ | Ti | 0.23 | 4.8 | 0.42 | 17.2 | 1.96 | 700 | 180 | 5.9 | 2.44 |
| Present Invention Example 22 | Cu/Ti + Mg/Al₂O₃ | Ti | 0.23 | 4.8 | 0.42 | 17.2 | 1.96 | 700 | 240 | 3.9 | 2.46 |
| Present Invention Example 23 | Cu/Ti + Mg/Al₂O₃ | Ti | 1.06 | 22.1 | 0.52 | 21.2 | 1.96 | 850 | 5 | 14.8 | 2.18 |
| Present Invention Example 24 | Cu/Ti + Mg/Al₂O₃ | Ti | 1.06 | 22.1 | 0.52 | 21.2 | 1.96 | 850 | 60 | 0.9 | 2.54 |
| Present Invention Example 25 | Cu/Ti + Mg/Al₂O₃ | Ti | 1.06 | 22.1 | 0.52 | 21.2 | 1.96 | 850 | 240 | 0.2 | 2.47 |
| Present Invention Example 26 | Cu/Zr/Mg/Al₂O₃ | Zr | 1.35 | 14.8 | 0.31 | 12.9 | 0.98 | 750 | 20 | 9.8 | 2.24 |
| Present Invention Example 27 | Cu/Zr/Mg/Al₂O₃ | Zr | 1.35 | 14.8 | 0.31 | 12.9 | 0.98 | 750 | 40 | 7.4 | 2.37 |
| Present Invention Example 28 | Cu/Zr/Mg/Al₂O₃ | Zr | 1.35 | 14.8 | 0.31 | 12.9 | 0.98 | 750 | 90 | 1.3 | 2.49 |
| Present Invention Example 29 | Cu/Ti + Hf + Mg/Al₂O₃ | Ti | 0.48 | 10.1 | 0.85 | 35.0 | 0.294 | 670 | 240 | 5.8 | 2.38 |
| | | Hf | 0.80 | 4.5 | | | | | | | |
| Present Invention Example 30 | Cu/Ti + Zr + Mg/Al₂O₃ | Ti | 0.65 | 13.5 | 0.29 | 12.0 | 0.49 | 680 | 240 | 16.4 | 1.89 |
| | | Zr | 1.23 | 13.5 | | | | | | | |
| Present Invention Example 31 | Cu/Ti + Zr + Mg/Al₂O₃ | Ti | 0.65 | 13.5 | 0.29 | 12.0 | 0.49 | 680 | 60 | 17.8 | 1.76 |
| | | Zr | 1.23 | 13.5 | | | | | | | |
| Present Invention Example 32 | Cu/Zr + Hf/Mg/Al₂O₃ | Zr | 0.12 | 1.3 | 2.05 | 84.5 | 0.49 | 850 | 60 | 22.7 | 1.22 |
| | | Hf | 0.20 | 1.1 | | | | | | | |

*"A + B" means codeposition of A and B.

It was confirmed from comparison between Present Invention Examples 21 to 32 that the lower the area ratio of the Cu—Mg intermetallic compound phases, the higher the pull strength. Therefore, it was confirmed that in a case of improving ultrasonic bonding properties, it is effective to suppress the area ratio of the Cu—Mg intermetallic compound phases to a low value.

Example 3

Bonded bodies of copper and ceramic having a structure shown in Table 4 were formed. Specifically, a bonded body of copper and ceramic was formed by laminating copper sheets in which the simple substance of an active metal and Mg simple substance were formed into films on both surfaces of a 40 mm square ceramic substrate made of alumina as shown in Table 4 and bonding the laminated sheets under bonding conditions shown in Table 4. The thickness of the ceramic substrate was 0.635 mm. In addition, the degree of vacuum of the vacuum furnace at the time of bonding was $5 \times 10^{-3}$ Pa.

Regarding the bonded bodies of copper and ceramic obtained as described above, the bonding interface was observed, and the thickness of a magnesium oxide layer, a Mg solid solution layer, intermetallic compound phases, and the presence or absence of Cu particles and the Cu concentration in the magnesium oxide layer were checked. In addition, the initial bonding rate of the bonded body of copper and ceramic, and cracking of the ceramic substrate during the thermal cycle load were evaluated.

The Mg solid solution layer, the intermetallic compound phases, the presence or absence of Cu particles and the Cu concentration in the magnesium oxide layer, and the initial bonding rate of the bonded body of copper and ceramic were evaluated in the same manner as in Example 1.

(Thickness of Magnesium Oxide Layer)

The bonding interface between the copper sheet and the ceramic substrate was observed using a transmission electron microscope (Titan ChemiSTEM manufactured by Thermo Fisher Scientific) at an accelerating voltage of 200 kV and a magnification of 20,000 times, and in the element mapping obtained, a case where a region where Mg and O coexisted was identified as a magnesium oxide layer. The magnesium oxide layer may contain any of magnesia (MgO) and spinel ($MgAl_2O_4$).

In addition, the thickness of the magnesium oxide layer was calculated by dividing the area of the magnesium oxide layer by the observation width in the observation visual field.

(Thermal Cycle Test)

Using a thermal shock tester (TSA-72ES manufactured by ESPEC Corp.), 250 cycles, where one cycle was 10 minutes at −50° C. and 10 minutes at 175° C., was performed in a gas phase.

The presence or absence of cracking in the ceramic substrate was checked every 10 cycles. The presence or absence of ceramic cracking was determined from an interface inspection using an ultrasonic flaw detector (FineSAT200 manufactured by Hitachi Power Solutions Co., Ltd.). In Table 5, ">250" indicates that no cracking was confirmed after 250 cycles.

TABLE 4

| | | Active metal and Mg disposing step | | | | | | | |
|---|---|---|---|---|---|---|---|---|---|
| | | | Amount of active metal | | Amount of Mg | | Load | Temperature | Time |
| | Film configuration* | Element | mg/cm² | μmol/cm² | mg/cm² | μmol/cm² | MPa | ° C. | min |
| Present Invention Example 41 | Cu/Ti + Mg/Al₂O₃ | Ti | 0.23 | 4.8 | 0.42 | 17.2 | 1.96 | 700 | 30 |
| Present Invention Example 42 | Cu/Ti + Mg/Al₂O₃ | Ti | 0.23 | 4.8 | 0.42 | 17.2 | 1.96 | 700 | 120 |
| Present Invention Example 43 | Cu/Ti + Mg/Al₂O₃ | Ti | 0.23 | 4.8 | 0.42 | 17.2 | 1.96 | 700 | 240 |
| Present Invention Example 44 | Cu/Zr/Mg/Al₂O₃ | Zr | 1.35 | 14.8 | 0.31 | 12.9 | 0.98 | 750 | 60 |
| Present Invention Example 45 | Cu/Zr/Mg/Al₂O₃ | Zr | 1.35 | 14.8 | 0.31 | 12.9 | 0.98 | 750 | 90 |
| Present Invention Example 46 | Cu/Zr/Mg/Al₂O₃ | Zr | 1.35 | 14.8 | 0.31 | 12.9 | 0.98 | 750 | 120 |
| Present Invention Example 47 | Cu/Ti + Zr/Mg/Al₂O₃ | Ti | 0.18 | 3.7 | 0.47 | 19.3 | 0.294 | 710 | 150 |
| | | Zr | 0.68 | 7.5 | | | | | |
| Present Invention Example 48 | Cu/Ti + Zr/Mg/Al₂O₃ | Ti | 0.18 | 3.7 | 0.47 | 19.3 | 0.294 | 770 | 150 |
| | | Zr | 0.68 | 7.5 | | | | | |
| Present Invention Example 49 | Cu/Ti + Zr/Mg/Al₂O₃ | Ti | 0.18 | 3.7 | 0.47 | 19.3 | 0.294 | 830 | 150 |
| | | Zr | 0.68 | 7.5 | | | | | |
| Present Invention Example 50 | Cu/Ti + Hf + Mg/Al₂O₃ | Ti | 0.48 | 10.1 | 0.85 | 35.0 | 0.294 | 670 | 60 |
| | | Hf | 0.80 | 4.5 | | | | | |
| Present Invention Example 51 | Cu/Ti + Hf + Mg/Al₂O₃ | Ti | 0.48 | 10.1 | 0.85 | 35.0 | 0.294 | 670 | 150 |
| | | Hf | 0.80 | 4.5 | | | | | |
| Present Invention Example 52 | Cu/Ti + Hf + Mg/Al₂O₃ | Ti | 0.48 | 10.1 | 0.85 | 35.0 | 0.294 | 670 | 240 |
| | | Hf | 0.80 | 4.5 | | | | | |

*"A + B" means codeposition of A and B.

TABLE 5

| | Observation results of bonding interface | | | | | Initial bonding ratio (%) | Number of cycles at ceramic cracking (cycles) |
|---|---|---|---|---|---|---|---|
| | Mg solid solution layer | Intermetallic compound phases | Thickness (nm) of magnesium oxide layer | Cu particles | Cu concentration (at %) | | |
| Present Invention 41 | Present | Present | 193 | Present | 9.9 | 96.4 | >250 |
| Present Invention 42 | Present | Present | 378 | Present | 10.8 | 98.7 | >250 |
| Present Invention 43 | Present | Present | 540 | Present | 11.1 | 98.5 | 220 |
| Present Invention 44 | Present | Present | 322 | Present | 9.3 | 98.7 | >250 |
| Present Invention 45 | Present | Present | 415 | Present | 8.6 | 98.8 | 250 |
| Present Invention 46 | Present | Present | 475 | Present | 9.7 | 98.5 | 240 |
| Present Invention 47 | Present | Present | 484 | Present | 8.4 | 95.9 | 240 |
| Present Invention 48 | Present | Present | 665 | Present | 9.5 | 97.0 | 210 |
| Present Invention 49 | Present | Present | 981 | Present | 10.1 | 99.1 | 180 |
| Present Invention 50 | Present | Present | 50 | Present | 5.8 | 92.9 | >250 |
| Present Invention 51 | Present | Present | 79 | Present | 6.5 | 95.3 | >250 |
| Present Invention 52 | Present | Present | 104 | Present | 7.3 | 97.8 | >250 |

In Present Invention Examples 41 to 52 in which the thickness of the magnesium oxide layer was in a range of 50 nm or more and 1000 nm or less, even in a case where a severe thermal cycle test at −50° C. to 175° C. was conducted, the number of thermal cycles at which ceramic cracking had occurred was 180 times or more, and it was confirmed that the thermal cycle reliability was excellent. In particular, in Present Invention Examples 41, 42, 44, and 50 to 52 in which the thickness of the magnesium oxide layer was in a range of 50 nm or more and 400 nm or less, cracking of the ceramic substrate was not confirmed even after a load of 250 thermal cycles, and it was confirmed that the thermal cycle reliability was particularly excellent.

From the above description, in a case where the thermal cycle reliability is further required, it is preferable that the magnesium oxide layer has a thickness of 50 nm or more and 1000 nm or less, and particularly 50 nm or more and 400 nm or less.

INDUSTRIAL APPLICABILITY

According to the present invention, it becomes possible to provide a bonded body of copper and ceramic in which a copper member made of copper or a copper alloy and a ceramic member made of an aluminum oxide are reliably bonded to each other and excellent electrochemical migration resistance is achieved, an insulating circuit substrate, a production method of the above-described bonded body of copper and ceramic, and a production method of the insulating circuit substrate.

REFERENCE SIGNS LIST 10, 110 Insulating circuit substrate
11, 111 Ceramic substrate
12, 112 Circuit layer
13, 113 Metal layer
22, 23, 122 Copper sheet
31, 131 Magnesium oxide layer
32, 132 Mg solid solution layer
33, 133 Intermetallic compound phases
35, 135 Cu particles

What is claimed is:

1. A bonded body of copper and ceramic comprising:
a copper member made of copper or a copper alloy and a ceramic member made of an aluminum oxide, the copper member and the ceramic member being bonded to each other;
a magnesium oxide layer which is formed on a ceramic member side between the copper member and the ceramic member; and
a Mg solid solution layer which is formed between the magnesium oxide layer and the copper member and contains Mg in a state of a solid solution in a Cu primary phase,
wherein one or more active metals selected from Ti, Zr, Nb, and Hf are present in the Mg solid solution layer; and
wherein a thickness of the magnesium oxide layer is in a range of 50 nm or more and 1000 nm or less.

2. The bonded body of copper and ceramic according to claim 1,
wherein intermetallic compound phases containing Cu and the one or more active metals are dispersed in the Mg solid solution layer.

3. The bonded body of copper and ceramic according to claim 1,
wherein Cu particles are dispersed in the magnesium oxide layer.

4. The bonded body of copper and ceramic according to claim 1,
wherein a ratio of an area of Cu—Mg intermetallic compound phases in an area of a region from a bonding surface of the ceramic member to 50 μm toward a copper member side is 15% or less.

5. An insulating circuit substrate comprising:
a copper sheet made of copper or a copper alloy and a ceramic substrate made of an aluminum oxide, the copper sheet being bonded to a surface of the ceramic substrate;
a magnesium oxide layer which is formed between the copper sheet and the ceramic substrate on a ceramic substrate side; and
a Mg solid solution layer which is formed between the magnesium oxide layer and the copper sheet and contains Mg in a state of a solid solution in a Cu primary phase,
wherein one or more active metals selected from Ti, Zr, Nb, and Hf are present in the Mg solid solution layer; and
wherein a thickness of the magnesium oxide layer is in a range of 50 nm or more and 1000 nm or less.

6. The insulating circuit substrate according to claim 5,
wherein intermetallic compound phases containing Cu and the one or more active metals are dispersed in the Mg solid solution layer.

7. The insulating circuit substrate according to claim 5, wherein Cu particles are dispersed in the magnesium oxide layer.

8. The insulating circuit substrate according to claim 5, wherein a ratio of an area of Cu—Mg intermetallic compound phases in an area of a region from a bonding surface of the ceramic substrate to 50 μm toward a copper sheet side is 15% or less.

* * * * *